(12) United States Patent
Aurola

(10) Patent No.: US 8,426,897 B2
(45) Date of Patent: Apr. 23, 2013

(54) SEMICONDUCTOR APPARATUS

(76) Inventor: Artto Aurola, Espoo (FI)

(*) Notice: Subject to any disclaimer, the term of this patent is extended or adjusted under 35 U.S.C. 154(b) by 256 days.

(21) Appl. No.: 12/307,980

(22) PCT Filed: Dec. 1, 2006

(86) PCT No.: PCT/FI2006/050534
§ 371 (c)(1),
(2), (4) Date: Apr. 3, 2009

(87) PCT Pub. No.: WO2007/063192
PCT Pub. Date: Jun. 7, 2007

(65) Prior Publication Data
US 2009/0206436 A1 Aug. 20, 2009

(30) Foreign Application Priority Data
Dec. 1, 2005 (FI) .................................. 20051236

(51) Int. Cl.
*H01L 21/00* (2006.01)

(52) U.S. Cl.
USPC ........... 257/245; 257/414; 257/428; 257/429; 257/E31.091; 257/E21.089

(58) Field of Classification Search ......... 438/FOR. 137
See application file for complete search history.

(56) References Cited

U.S. PATENT DOCUMENTS

| 4,751,562 A | 6/1988 | Yamamura |
| 5,029,321 A | 7/1991 | Kimura |
| 5,889,313 A | 3/1999 | Parker |
| 5,981,988 A | 11/1999 | Conder et al. |
| 6,204,087 B1* | 3/2001 | Parker et al. ............ 438/56 |
| 6,710,418 B1 | 3/2004 | Sapp |
| 2004/0238743 A1 | 12/2004 | Gravrand et al. |

FOREIGN PATENT DOCUMENTS

| JP | 63015459 | 1/1988 |
| JP | 2003086827 | 3/2003 |
| WO | WO 2005/109510 | 11/2005 |
| WO | 2006/005803 | 1/2006 |

OTHER PUBLICATIONS

International Search Report for International Application No. PCT/FI2006/050534, dated Mar. 20, 2007.
Supplementary European Search Report, dated May 24, 2012.

* cited by examiner

*Primary Examiner* — Julio J Maldonado
*Assistant Examiner* — Mohammad Choudhry
(74) *Attorney, Agent, or Firm* — Barnes & Thornburg LLP

(57) ABSTRACT

An improved semiconductor apparatus that comprises an elongated structure that extends into the substrate. The apparatus comprises a collection contact, a resistive path, a bias connection that creates along the length of the elongated structure, an electric field component that drives signal charge carriers in a direction perpendicular to the elongated structure, and a second bias that generates a current flow that creates within the substrate a constant electric field component to drive signal charge carriers towards the collection contact on the first surface.

22 Claims, 16 Drawing Sheets

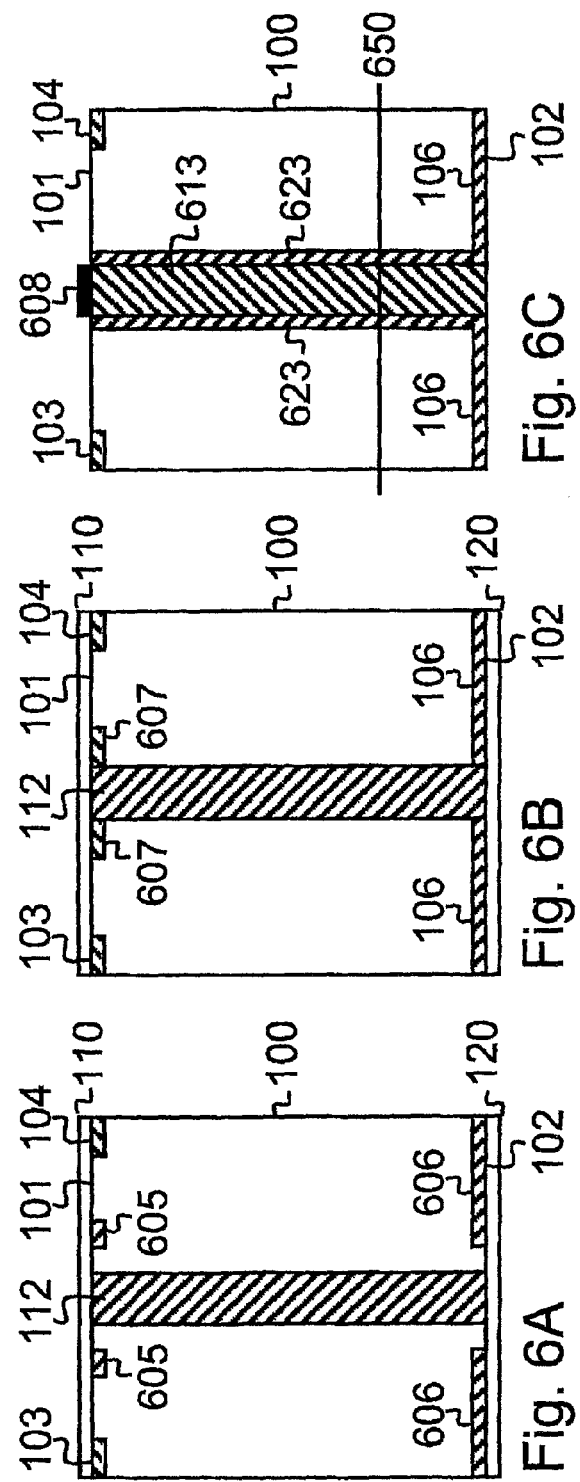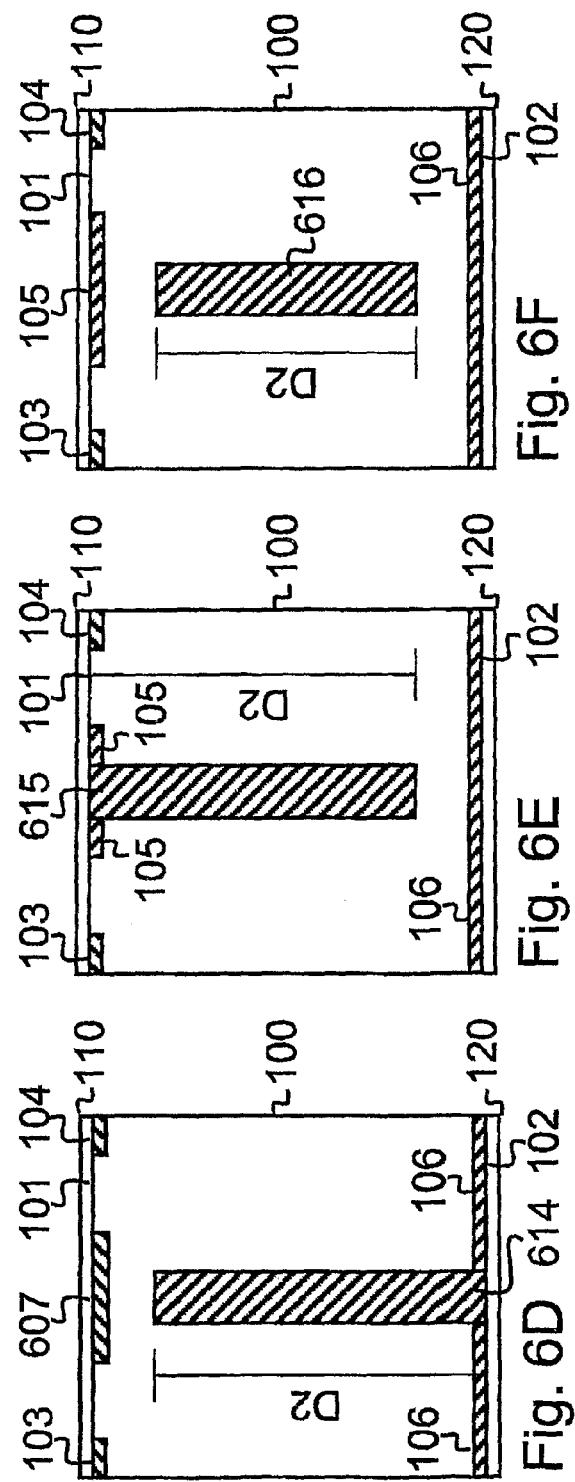

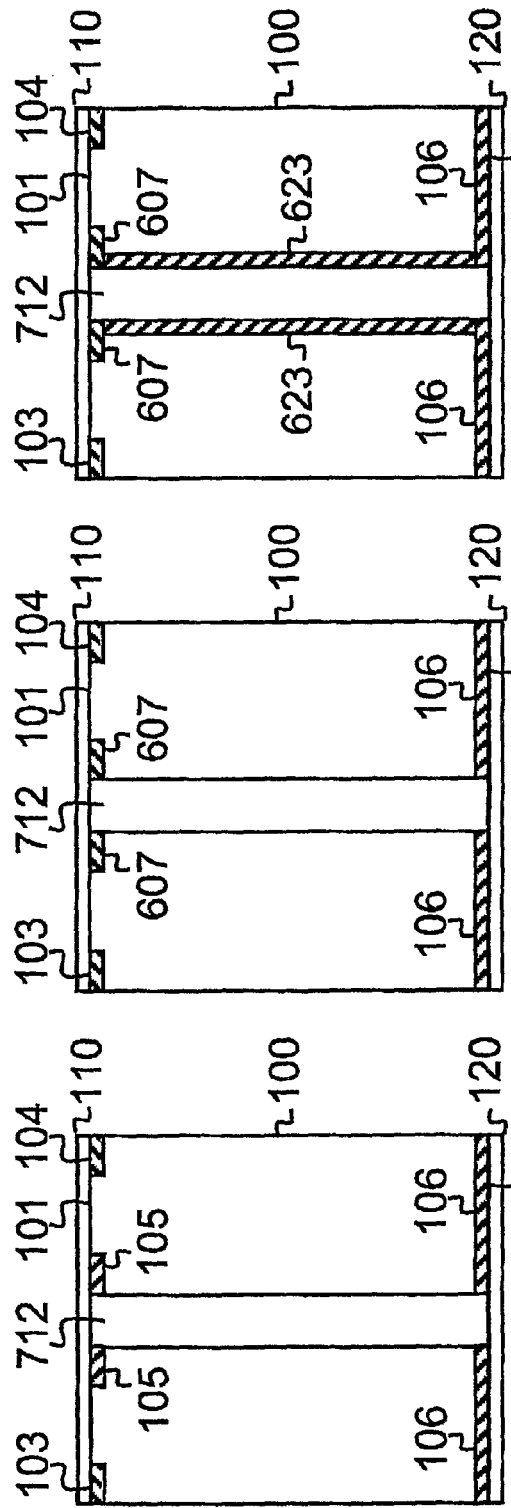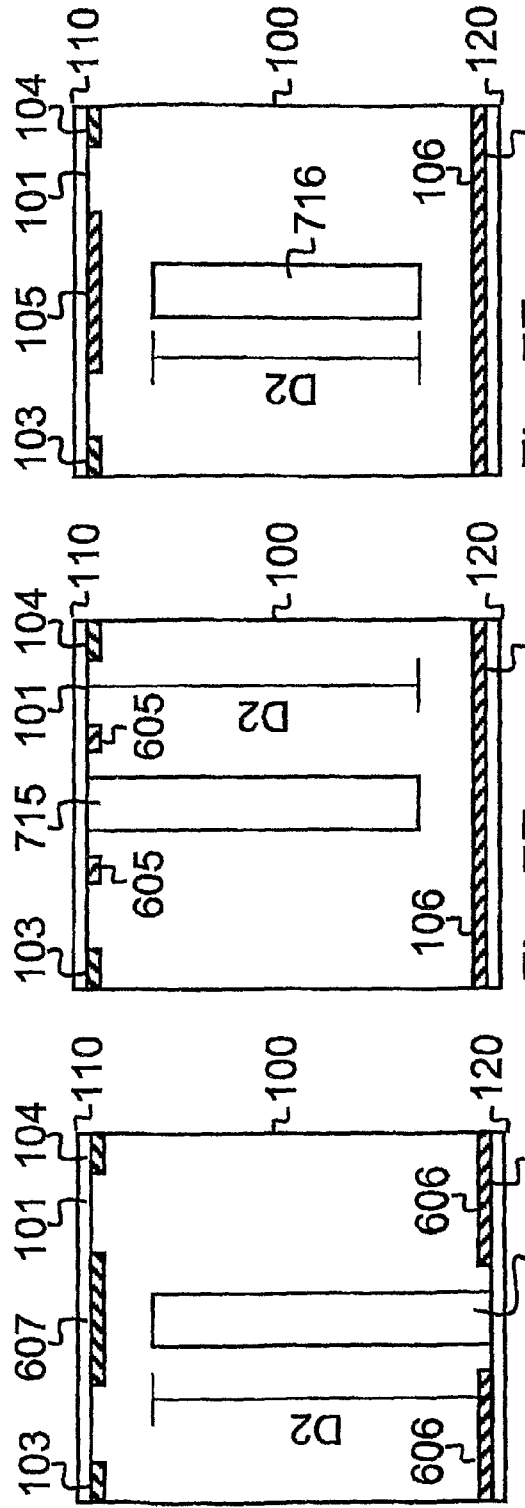

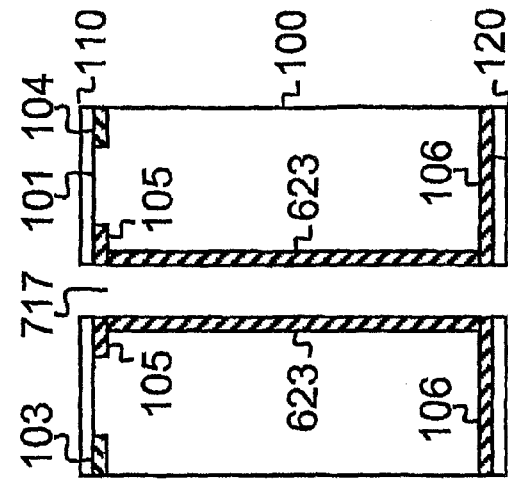
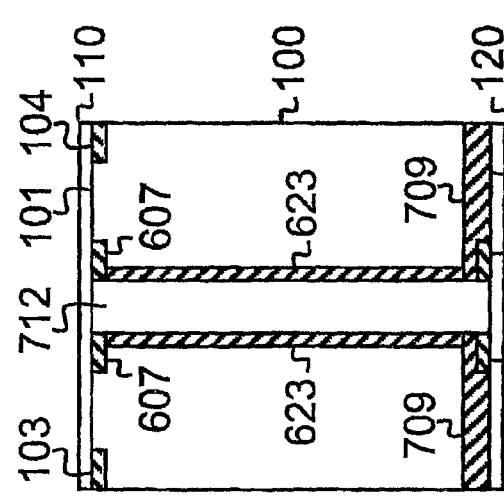
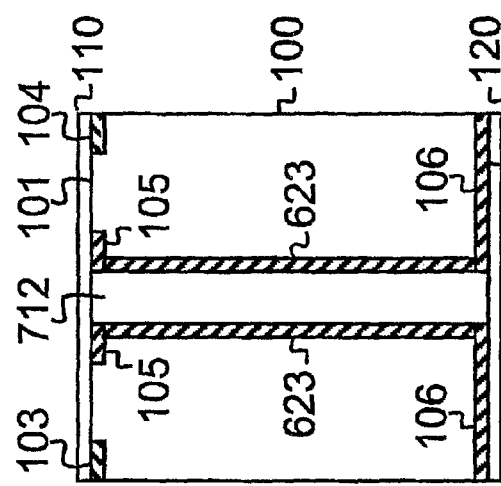
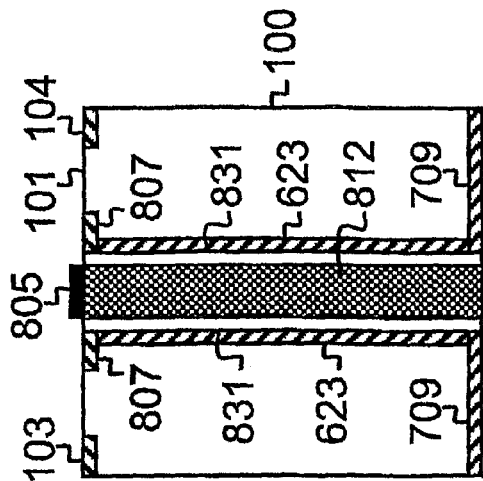
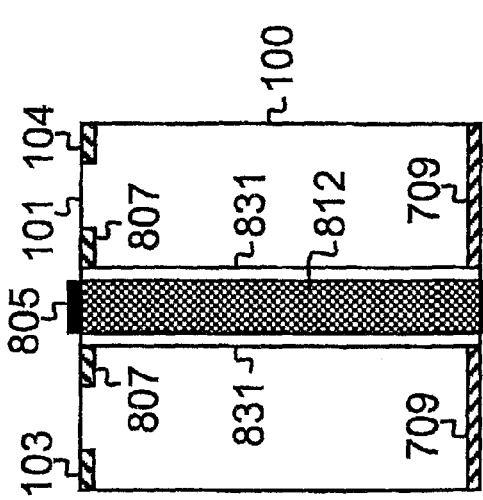
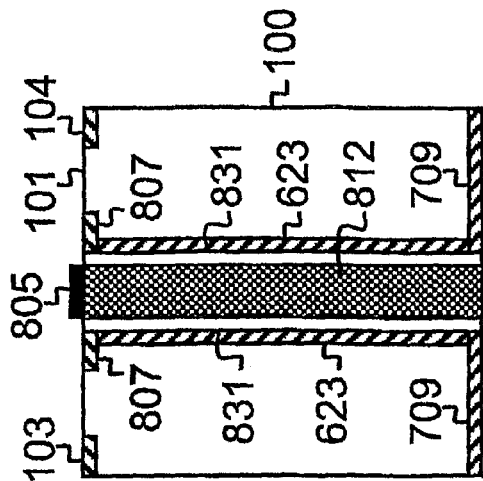

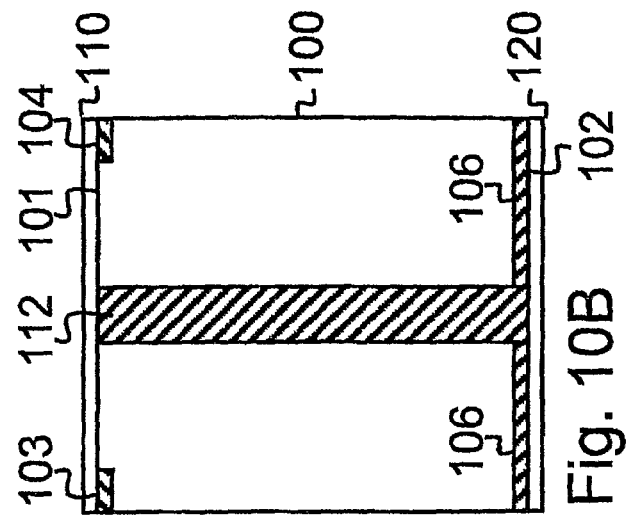
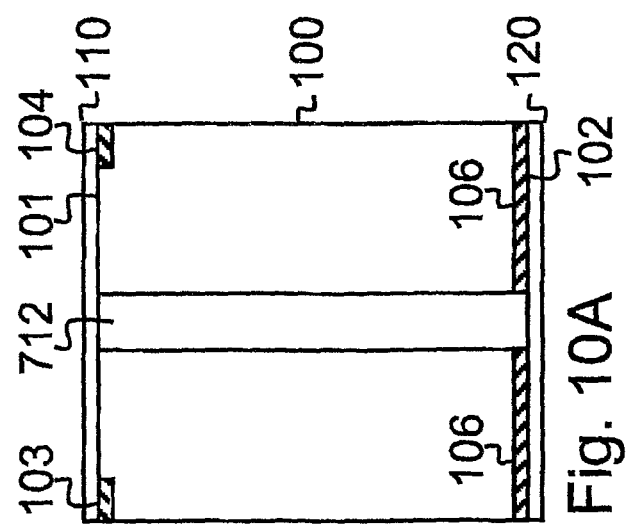

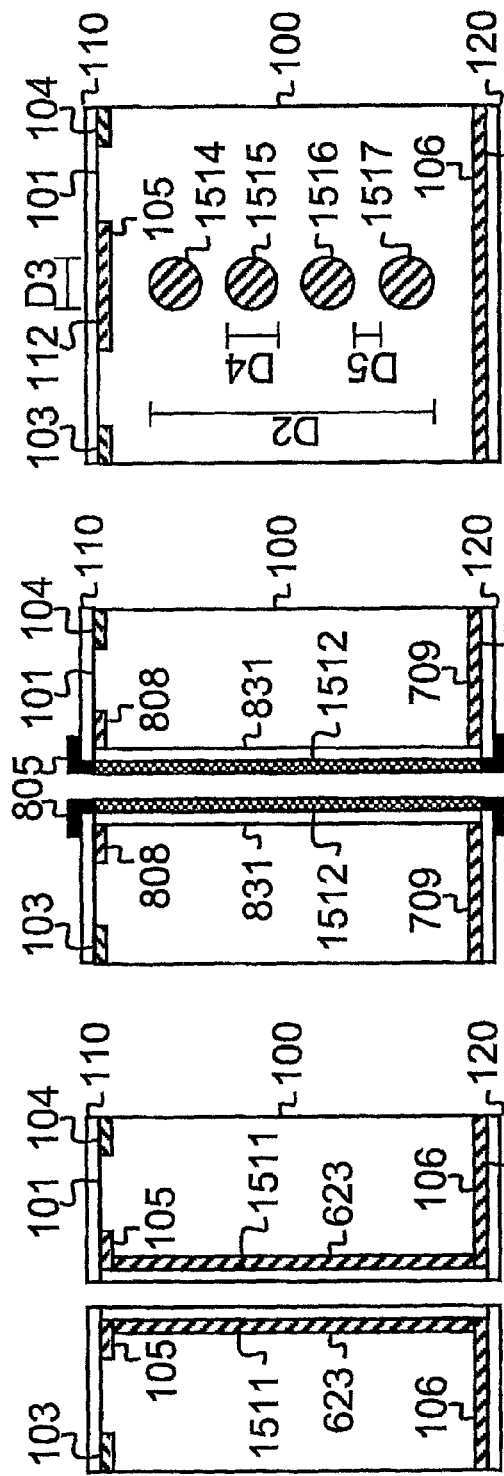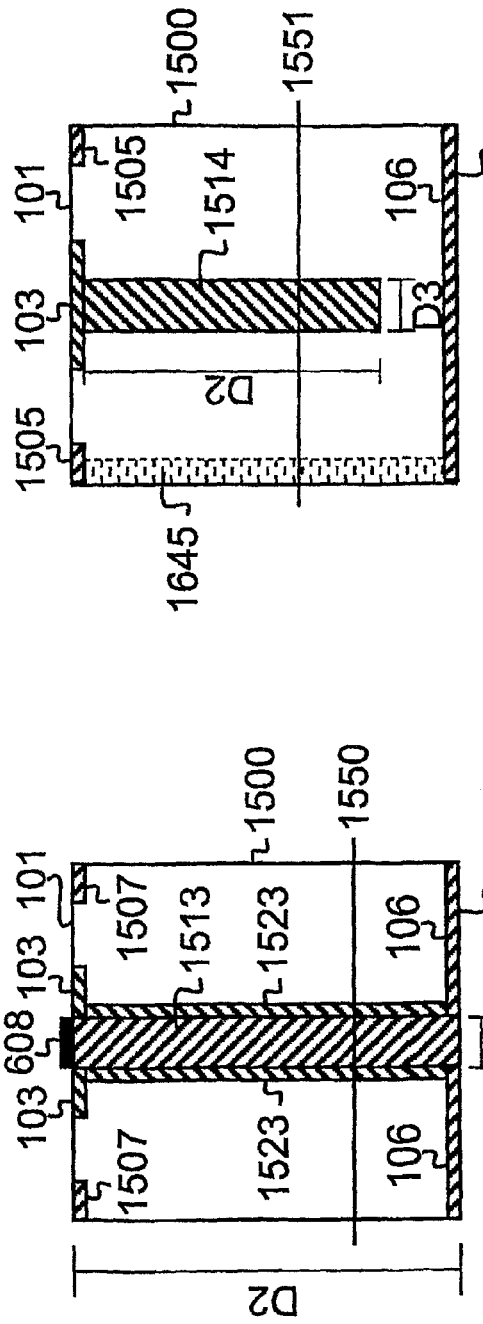

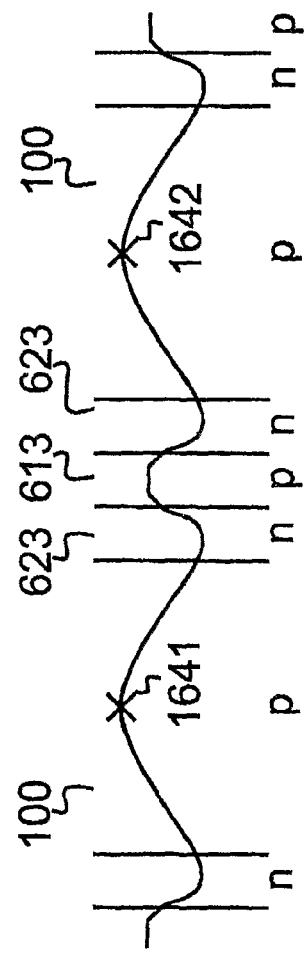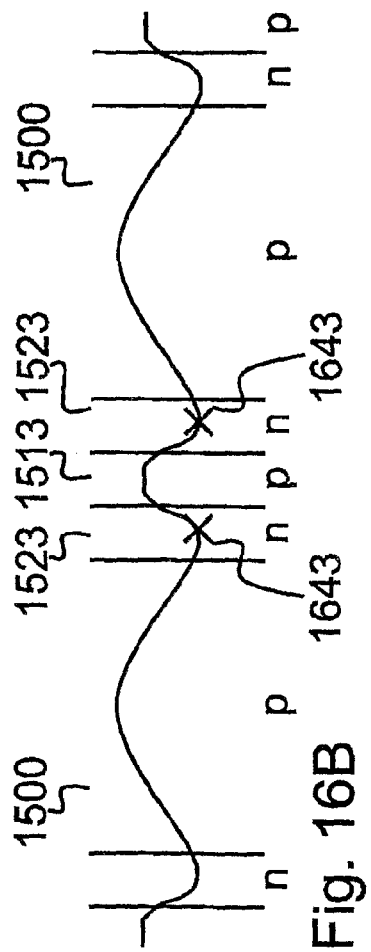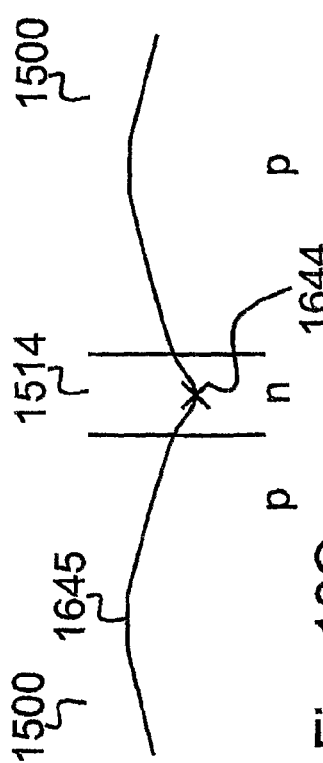

SEMICONDUCTOR APPARATUS

CROSS-REFERENCE TO RELATED APPLICATIONS

The present application claims the benefit of priority to International Patent Application No. PCT/FI2006/050534 filed Dec. 1, 2006, which further claims the benefit of priority to Finland Patent Application No. 20051236 filed Dec. 1, 2005, the contents of which are hereby incorporated by reference in their entirety.

FIELD OF THE INVENTION

The present invention relates to a semiconductor apparatus and more particularly to a three dimensional (3D) semiconductor apparatus that can be used for instance in radiation detectors and in power electronics.

BACKGROUND OF THE INVENTION

The operation principle of a semiconductor radiation detector is based on a depleted volume of semiconductor material. The depleted volume is created typically by a reverse biased pn junction, i.e. by a reverse biased diode. Radiation entering the semiconductor material creates electron hole pairs. The electric field in the depleted volume separates the electron hole pairs. In neutral semiconductor material the electron hole pairs recombine unless the minority carriers (holes in n type semiconductor material and electrons in p type material) are able to diffuse to the border of the depleted volume. The charge type that is measured will be hereinafter referred to as the signal charges and the opposite charge type as the secondary charges. The area of the semiconductor radiation detector containing the radiation detecting pixels (one or more) is hereinafter referred to as the active area. The ability of the semiconductor radiation detector to detect deeply penetrating radiation like energetic X rays and gamma rays depends on the semiconductor material and on the thickness of the depleted semiconductor volume.

The maximum electric field value in a pn diode is always at the pn junction and the electric field is the smaller the bigger is the distance from the junction. In planar detectors the junction is always close to the surface of the detector. The electric field in a planar detector is thus parallel to the surface normal of the detector and it is a monotonously decaying function of the depth. The direction parallel to the surface normal is herein after referred to as the vertical direction and the two directions on a plane parallel to the front and back surface of the detector are herein after referred to as the two horizontal directions. The maximum thickness of the depleted volume in planar semiconductor radiation detectors is determined by the electric break down field. This means that the planar semiconductor detectors have an upper detection efficiency limit for deeply penetrating radiation. Another problem in planar detectors is that one has to use very high voltages to create a thick depletion region. This is due to the fact that the depletion voltage is proportional to the square of the depletion region thickness. Yet another problem in thick planar detectors is horizontal spreading of the signal charge, which hampers spatial resolution.

In order to solve the aforesaid problems of the planar detectors 3D detectors have been introduced. U.S. Pat. Nos. 5,889,313 and 6,204,087 disclose a 3D detector that has highly doped n and p type 3D electrodes penetrating through a semiconductor substrate. The electric field inside the 3D semiconductor has a horizontal component but there is essentially no vertical component. The depletion voltage of the substrate is thus independent of the substrate thickness. The distance between the 3D electrodes can be made much smaller than the thickness of the semiconductor substrate and thus the depletion voltage of the 3D detector can be very small. The horizontal spreading of the signal charge is prevented due to the horizontal electric field component. The problem associated with this 3D detector is that in case of thick substrates the capacitance of the signal charge collecting 3D electrodes is relatively high due to the large surface area of the 3D electrodes and due to the small distance between the 3D electrodes. In thick substrates the sensitivity of the aforesaid 3D detector to measure the amount of the signal charge is thus deteriorated.

U.S. Pat. No. 5,981,988 discloses a 3D charge coupled device (CCD) that comprises 3D gates that penetrate through the substrate. The gates are made of conducting material and between the gates and the semiconductor substrate there is an isolator layer. The electric field in the 3D-CCD has a horizontal but essentially no vertical component enabling the depletion of a thick substrate with a small voltage and preventing horizontal spreading of the signal charge. The signal charge is collected around the 3D gates during the integration phase. During the signal charge transport phase the signal charge is trans-ported inside the substrate on a plane parallel to the front and back surfaces of the detector. If the radiation is detected continuously the 3D-CCD is, however, prone to smear which weakens the image quality. The smear effect is resulted during the signal charge transport phase because the signal charge collection cannot be turned off. Another problem in a thick 3D-CCD is the transportation of the signal charge from a location around the 3D-gate to a location on the surface of the device where the signal charge is measured. Yet another problem is that efficient collection of the secondary charge is difficult to perform.

PCT/FI2005/050148 discloses a 3D semiconductor detector that has 3D elements of one conductivity type protruding into a substrate of opposite conductivity type. The 3D elements and the substrate are connected to a voltage source, which is used to fully deplete the 3D elements and preferably the substrate too. The electric field inside the detector has due to the 3D elements a horizontal component. If in addition a plane that is parallel to the front and back surfaces of the detector and that is cutting the 3D elements and the substrate contains an equal amount of n and p type doping atoms the resulting vertical electric field component is constant. Due to the constant vertical field there is no limit for the thickness of the detector. The vertical electric field component is used to transport the signal and the secondary charges to the front and back surface of the detector. This 3D detector does not suffer from smear or from horizontal spreading of the signal charge and it has a small capacitance. The manufacturing of such a 3D detector is, however, problematic since it is difficult to precisely control the doping atom distribution inside the 3D detector. First of all, the substrate doping has to be known precisely. Secondly, the shapes of the 3D elements have to be controlled and known precisely which necessitates very accurate processing. Thirdly, the doping concentration of the semiconductor material forming the 3D elements has to be controlled and known precisely. If the manufacturing is not controlled precisely the vertical electric field component will not be constant. The result of this is that the thickness of the detector is limited.

In power electronics the voltage handling capability of a power device is a crucial parameter. The voltage handling capability of semiconductor power devices is, however, too low for many applications and thus non semiconductor based devices like vacuum tubes has to be used instead. The vacuum tubes are, however, bulky, expensive and they suffer from aging effects unlike the semiconductor based power devices. The voltage handling capability of semiconductor power devices is determined by the break down electric field. This fact applies to planar semiconductor power devices and to semiconductor power devices based on the 3D electrodes or 3D gates. This fact applies also to semiconductor power devices based on the 3D elements presented in PCT/FI2005/050148, unless the device is manufactured with extra ordinary precision. Another problem in planar semiconductor power devices is the horizontal spreading of the signal charge. Due to the horizontal spreading of the signal charge adjacent power elements, i.e. e.g. power transistors, have to be spaced far apart on the power chip surface. Unless mixing of signals belonging to adjacent power elements is resulted in.

Based on the above reasoning it is desired to have an improved semiconductor apparatus. The improvement can comprise one or more of the following advantages: the apparatus is easier to manufacture, it can have any desired thickness, it has a low capacitance, it is immune to smear, wherein horizontal spreading of the signal charge is prevented, it can withstand very high voltages and the maximum electric field does not depend on the thickness of the device.

SUMMARY OF THE INVENTION

The object of this invention is to provide a 3D semiconductor apparatus that has an essentially constant vertical electric field component inside the semiconductor substrate. Further objects of this invention are to provide a 3D semiconductor apparatus that can be as thick as desired, that is easy to manufacture, that has a low capacitance, that is immune to smear, wherein horizontal spreading of the signal charge is prevented, which can withstand very high voltages and wherein the maximum electric field does not depend on the thickness of the device.

The objects of the invention are achieved by the semiconductor apparatus, which is characterized by what is stated in the independent claims. The preferred embodiments of the invention are disclosed in the dependent claims.

The invention is based on the idea of providing at least one resistive path between the first surface, i.e. the front surface, and between the second surface, i.e. the back surface of the semiconductor apparatus. A potential difference applied between the front and back surface results in a current running through the aforesaid at least one resistive path. If the resistivity of the at least one resistive path is approximately constant along the vertical direction, an essentially constant vertical field is created inside the semiconductor substrate. This is a result of the ohmic relation U=R×I. The constant vertical field transports signal charges towards a surface of the semiconductor apparatus.

Since the potential difference between the two surfaces is fixed, different currents run through 3D structures having different resistances due to different horizontal shapes. The vertical electric field around resistive paths having different resistances is, however, the same. The resistivity of the 3D structures needs not to be controlled exactly since a higher resistivity results in smaller currents running through the 3D structures and a smaller resistivity results in larger currents running through the 3D structures. The vertical field inside the semiconductor apparatus is, however, the same. These facts simplify the manufacturing of the semiconductor apparatus according to the invention considerably. A semiconductor apparatus according to the invention can be as thick as desired due to the constant vertical field, i.e. the maximum electric field inside the semiconductor apparatus does not depend on the thickness of the semiconductor apparatus. Due to this fact the semiconductor apparatus according to the invention can withstand very high voltages. The capacitance of the signal charge collecting electrode is small and independent of the substrate thickness since the signal charge collecting electrode is a point like 2D electrode, i.e. it is not a 3D electrode having a large surface area. The signal charge is not transported horizontally like in the 3D-CCD, and thus no smear is resulted. Due to a horizontal electric field component inside the semiconductor apparatus horizontal spreading of the signal charge is prevented.

BRIEF DESCRIPTION OF THE DRAWINGS

In the following the invention will be described in greater detail by means of preferred embodiments with reference to the attached drawings, in which

FIGS. 6A-6F illustrate different embodiments of the semiconductor apparatus according to the present invention;

FIGS. 7A-7I illustrate different embodiments of the semiconductor apparatus according to the present invention;

FIGS. 8A-8C illustrate different embodiments of the semiconductor apparatus according to the present invention;

FIGS. 10A and 10B illustrate less advantageous devices;

FIGS. 15A-15E illustrate different embodiments of the semiconductor apparatus according to the invention;

FIGS. 16A, 16B and 16C illustrate electron potential curves on horizontal cut lines of the embodiments presented in FIGS. 6C, 15D and 15E.

DETAILED DESCRIPTION OF THE INVENTION

In planar semiconductor devices like in planar semiconductor radiation detectors there are contacts on the front surface collecting signal charges and contacts on the back surface collecting secondary charges. However, in planar detectors these two contacts have also two additional functions. First of all, these two contacts are reverse biased to deplete the semiconductor substrate. Secondly, these two contacts are used to create a vertical (non constant) electric field component transporting the signal charges towards the contact on the front surface and the secondary charges towards the contact on the back surface.

The 3D semiconductor apparatus according to the invention comprises a first contact on a front surface of a semiconductor substrate collecting signal charges. The 3D semiconductor apparatus comprises also on the back surface a second contact and an optional fourth contact either one of which can be used to collect secondary charges. The semiconductor apparatus according to the invention comprises further a third contact on the front surface of the semiconductor substrate, at least one 3D structure and at least one resistive path between the front surface and the back surface. The 3D structure is used for creating a horizontal electric field component which separates signal and secondary charges and for creating signal charge transporting and resistive paths between the front surface and the back surface. This is done by connecting a reverse bias between the 3D structure and the substrate. In order to provide the essentially constant vertical electric field component inside the semiconductor apparatus a current runs between the third contact on the front surface and the second contact on the back surface through the resistive path. The essentially constant vertical electric field component transports signal charges towards the front surface of the semiconductor substrate and secondary charges towards the back surface of the semiconductor substrate.

The resistance of the resistive path can be described by the ohmic relation $U = I \times R = I \times \rho \times L/A$, where U is the potential difference between the two ends of the resistive path, I is the current running through the resistive path, $\rho$ is the resistivity of the resistive path, L is the length of the resistive path and A is the cross-section area of the resistive path. If the cross-section area A is different in different 3D structures or if the resistivity $\rho$ is different than planned, the essentially constant vertical electric field component will not be altered. The only result is that the current I running through the resistive path is altered. The only requirements to create the essentially constant vertical electric field component are that the resistivity $\rho$ and the cross-section area A of the resistive path are approximately constant along the vertical direction.

Figure 1:
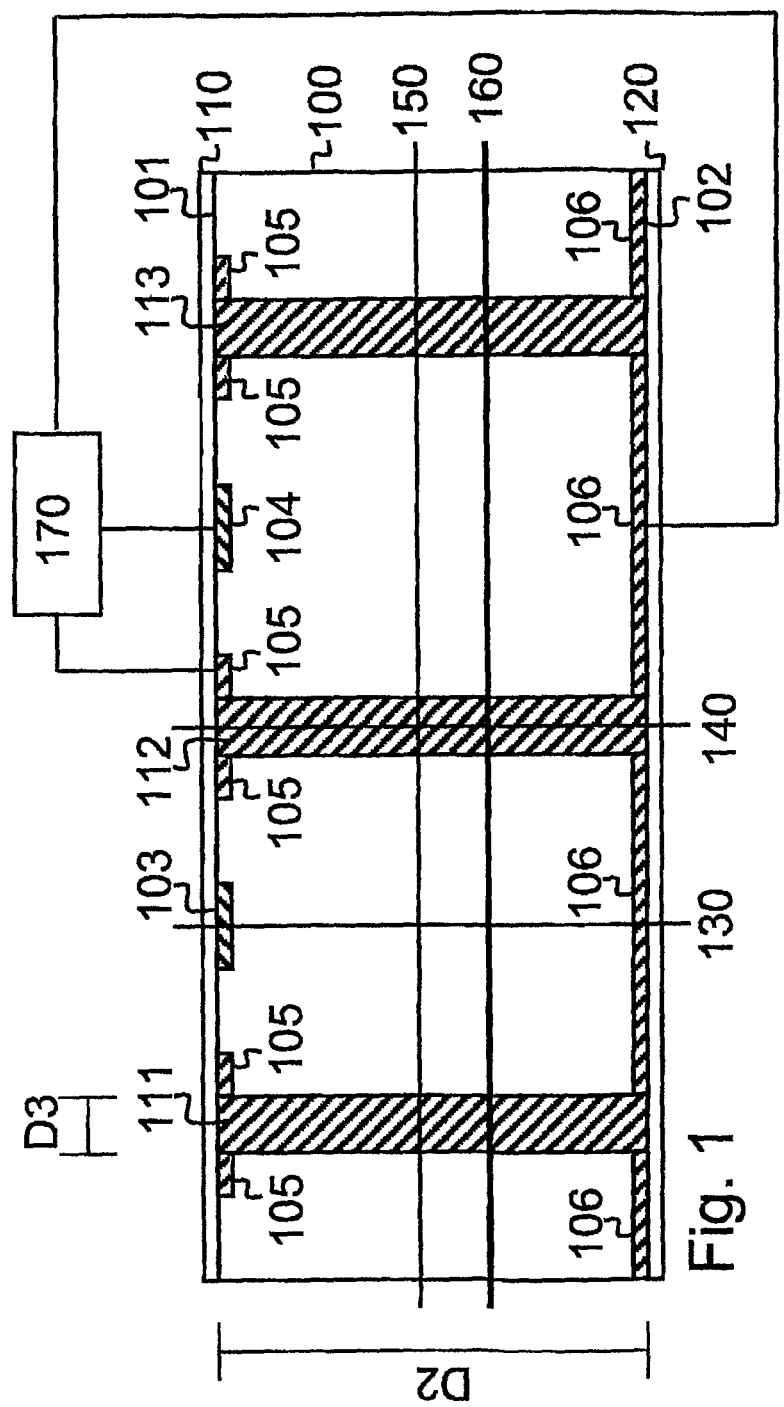
FIG. 1 illustrates an embodiment of the semiconductor apparatus according to the present invention.
Figure 2:
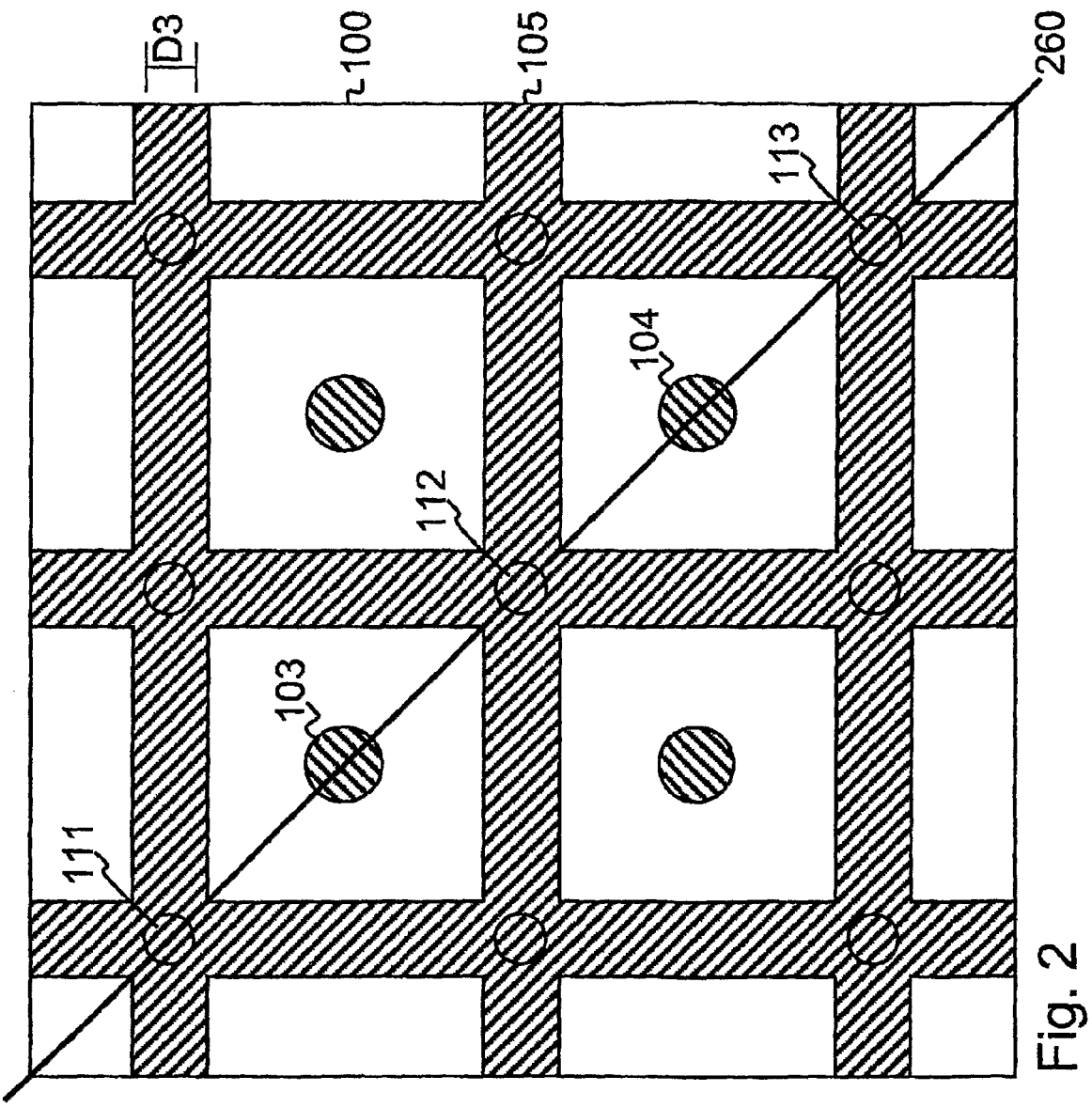
FIG. 2 illustrates the front surface of the semiconductor apparatus presented in FIG. 1.
Figure 3:
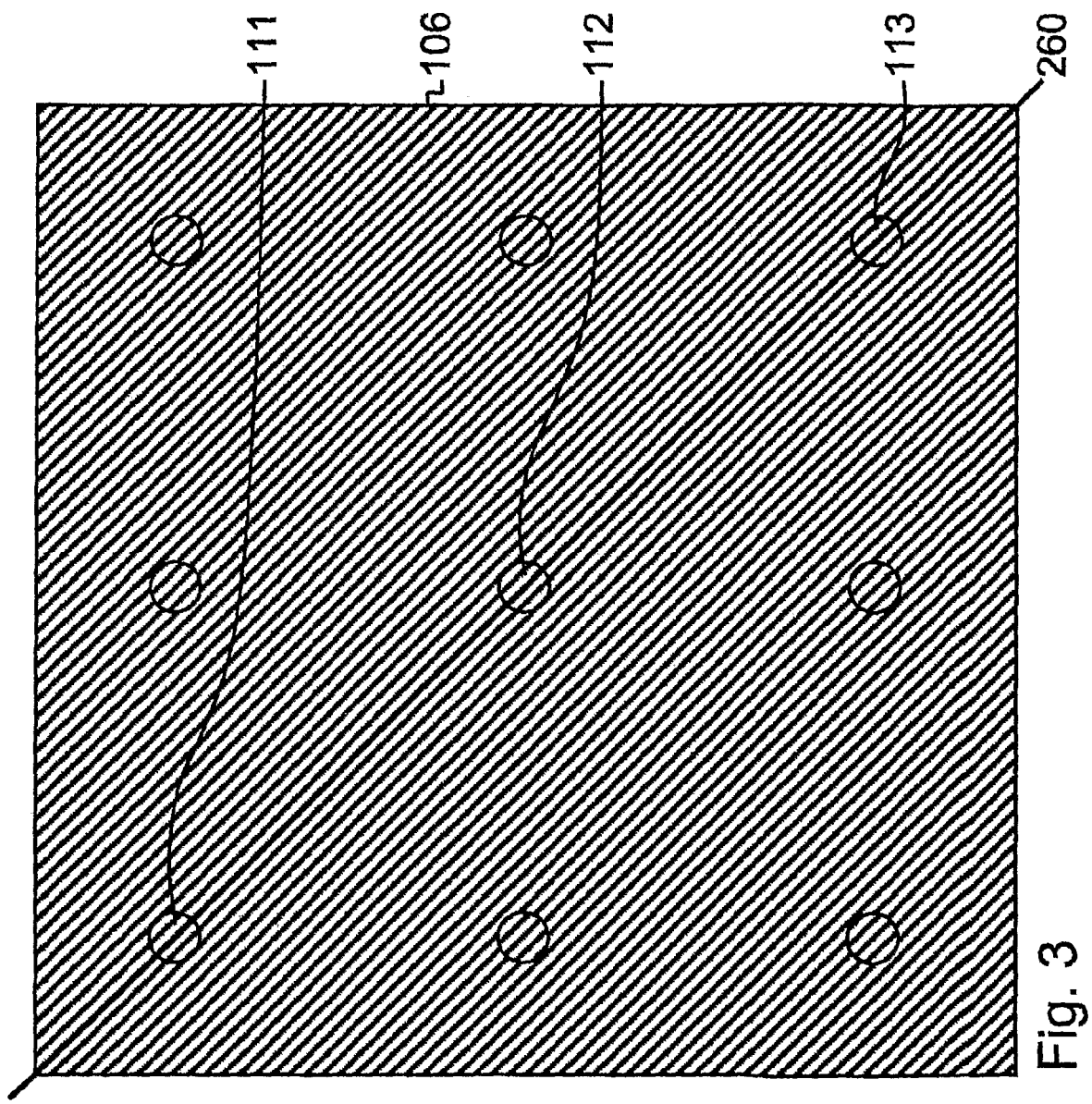
FIG. 3 illustrates the back surface of the semiconductor apparatus presented in FIG. 1.

FIG. 1 illustrates a vertical cross-section of an embodiment of a semiconductor apparatus according to the invention. This 3D radiation detector has a first type semiconductor substrate 100 having a first surface 101, the directions on a plane parallel to the first surface 101 referred to as the horizontal directions and the direction parallel to the surface normal of the first surface referred to as the vertical direction, and at a first vertical distance D1 from the first surface a second surface 102 parallel to the first surface. The first and second surfaces are also referred to as the front and back surface. On top of the front and back surfaces are optional protective electrical isolator layers 110 and 120. The signal charges are collected by a first contact 103, 104 on the front surface and the secondary charges are collected by a second contact 106 on the back surface. On the front surface there is a third contact 105. The first contact is a first type doping and the second contact is a second type doping. The third contact is in this embodiment a second type doping. The first, second and third contacts could, however, be made of suitable metals or conductors. The radiation detector comprises three dimensional structures 111, 112, 113, that are in this embodiment composed of second type semiconductor material. FIGS. 2 and 3 illustrate the front and back surface of the detector where the diagonal cut line 260 corresponds to the cross-section presented by FIG. 1.

Figure 9:
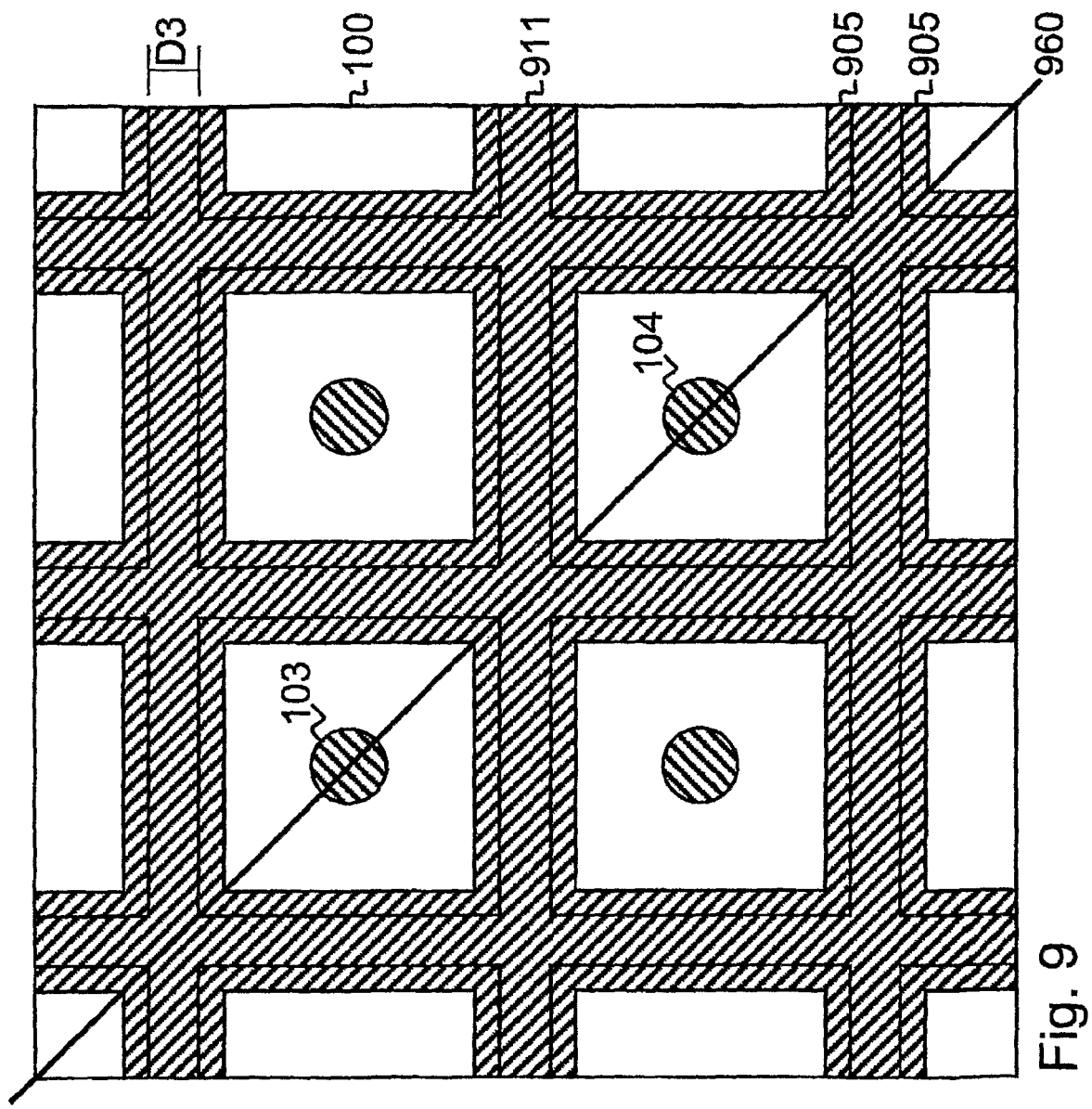
FIG. 9 illustrates a different embodiment of the semiconductor apparatus according to the present invention.

The three dimensional structures are defined as having a length D2 between the first surface and the second surface, the length D2 being longer than a smallest cross-section D3 of the three dimensional structure. In FIG. 1 the length D2 is the same as the first vertical distance and in FIGS. 6D, 6E and 6F the length D2 is smaller than the first vertical distance. Relations for the length D2 with respect to the first vertical distance can be listed in order of preference: $D2 \geq 0.5 \times D1$, $D2 \geq 0.6 \times D1$, $D2 \geq 0.7 \times D1$, $D2 \geq 0.8 \times D1$, $D2 \geq 0.9 \times D1$, $D2 = D1$ where the last one is the most beneficial relation. The smallest cross-section of the three dimensional structure is illustrated in FIGS. 1, 2 and 3, where it corresponds to the diameter of the cylindrical three dimensional structures. The three dimensional structure may, however, have a different shape than the one presented in FIGS. 1, 2 and 3. An example is given in FIG. 9 where the form of the three dimensional structure 911 on the front surface of the structure resembles a net. The smallest cross-section D3 of the net like three dimensional structure, in the given example a net-like lattice, is also depicted in FIG. 9. The second type doping 905 on the front surface corresponds to the third contact 105 of FIG. 1 and the cut line 960 corresponds to the cross-section presented by FIG. 1.

The three dimensional structure is defined by the length D2 and by the smallest cross-section D3, due to the fact that such structures can not be obtained using traditional planar manufacturing methods. Instead one has to etch deep holes into a semiconductor substrate. Typically the length D2 is considerably bigger than D3, so advantageously inequalities can be listed in order of preference: $D2 > 20 \times D3$, $D2 > 10 \times D3$, $D2 > 5 \times D3$, $D2 > 4 \times D3$, $D2 > 3 \times D3$, $D2 > 2 \times D3$, $D2 > D3$, where the first one is the most beneficial inequality.

In operation the first, second and third contacts of the 3D detector of FIG. 1 are connected to the bias voltage source 170. If the first type is assumed as p type and the second type is assumed as n type, the electron potential energy diagrams on cut lines 130, 140 and 150 are presented by the FIGS. 4A, 4B and 4C. The operation principle of the 3D detector can be explained in the following manner. The second and third contacts are first connected to the same potential and a reverse bias is applied between them and the first contact in order to essentially fully deplete the semiconductor substrate. Due to the n type three dimensional structures the p type substrate can be depleted using a relatively small reverse bias voltage. The electron potential energy diagram of FIG. 4C on the horizontal cut line 150 corresponds to the situation where the substrate is fully depleted. The electron potential energy gradient of the diagram presented in FIG. 4C corresponds to the horizontal electric field component that transports the signal charge holes towards the electron potential energy maximum 441, 442, i.e. towards the hole potential energy minimum 441, 442, between the 3D structures, the hole potential energy minimum 441, 442 forming a signal charge transporting path.

Figure 4A:
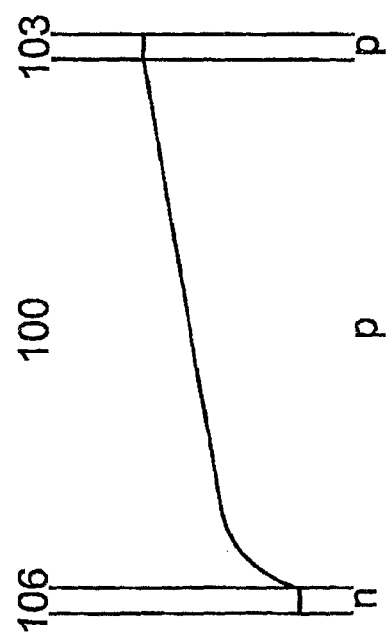
FIGS. 4A, 4B and 4C illustrate electron potential curves on different cut lines of the semiconductor apparatus presented in FIG. 1.
Figure 4B:
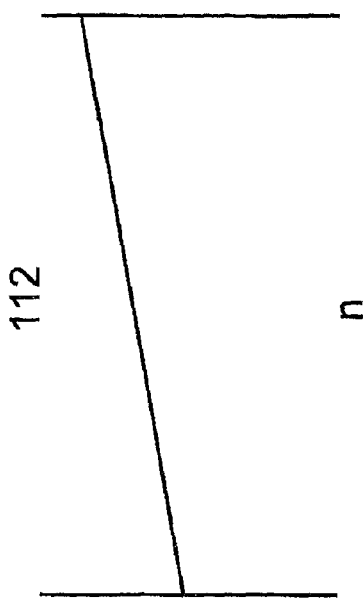
Figure 4C:
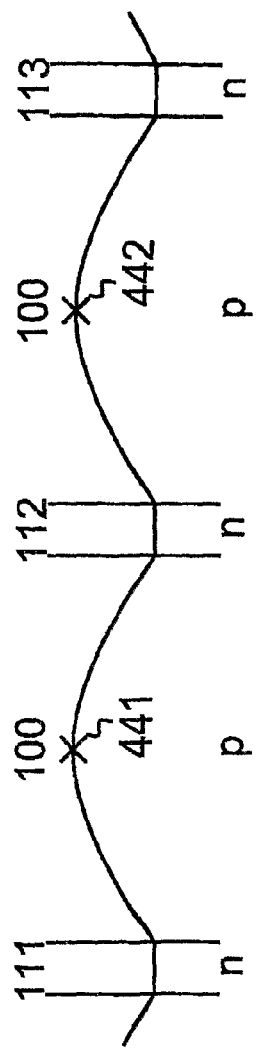

The 3D structures 111, 112, 113 provide high resistive paths between the front and back surface. Next a higher potential, i.e. a smaller electron energy potential is applied to the second contact on the back surface of the structure than to the third contact on the front surface of the structure. This results in a second type current running from the second contact to the third contact through the high resistive path provided by the 3D structure. The 3D structures act as ohmic resistors, i.e. they follow the relation $U = R \times I$, where U is the potential difference between the second contact and the third contact, R is the resistance of the 3D structure and I is the current running through the 3D structure. If the 3D structure is cut to equally thick horizontal slices and the resistances of the slices are approximately the same an approximately constant vertical electric field component will be resulted inside the substrate and inside the 3D structure. If the resistances of different 3D structures are not equal, the currents running through the 3D structures will be different. The vertical electric field component will, however, be essentially the same around and inside the different 3D structures. The constant vertical electric field component in the hole potential energy minimum locations 441, 442 transports the signal charge holes towards the first contact on the front surface. This essentially constant vertical electric field component corresponds to the straight part of the electron potential energy diagram presented in FIG. 4A. The electron potential energy diagram of FIG. 4A is bent close to the back surface due to the n type second contact 106. The essentially constant vertical electric field component inside the 3D structure corresponds to the straight electron potential energy diagram presented in FIG. 4B and the horizontal electric field component that transports the signal charge holes towards the hole potential energy minimum 441, 442 corresponds to the gradient of the electron potential energy diagram presented in FIG. 4C.

Figure 5:
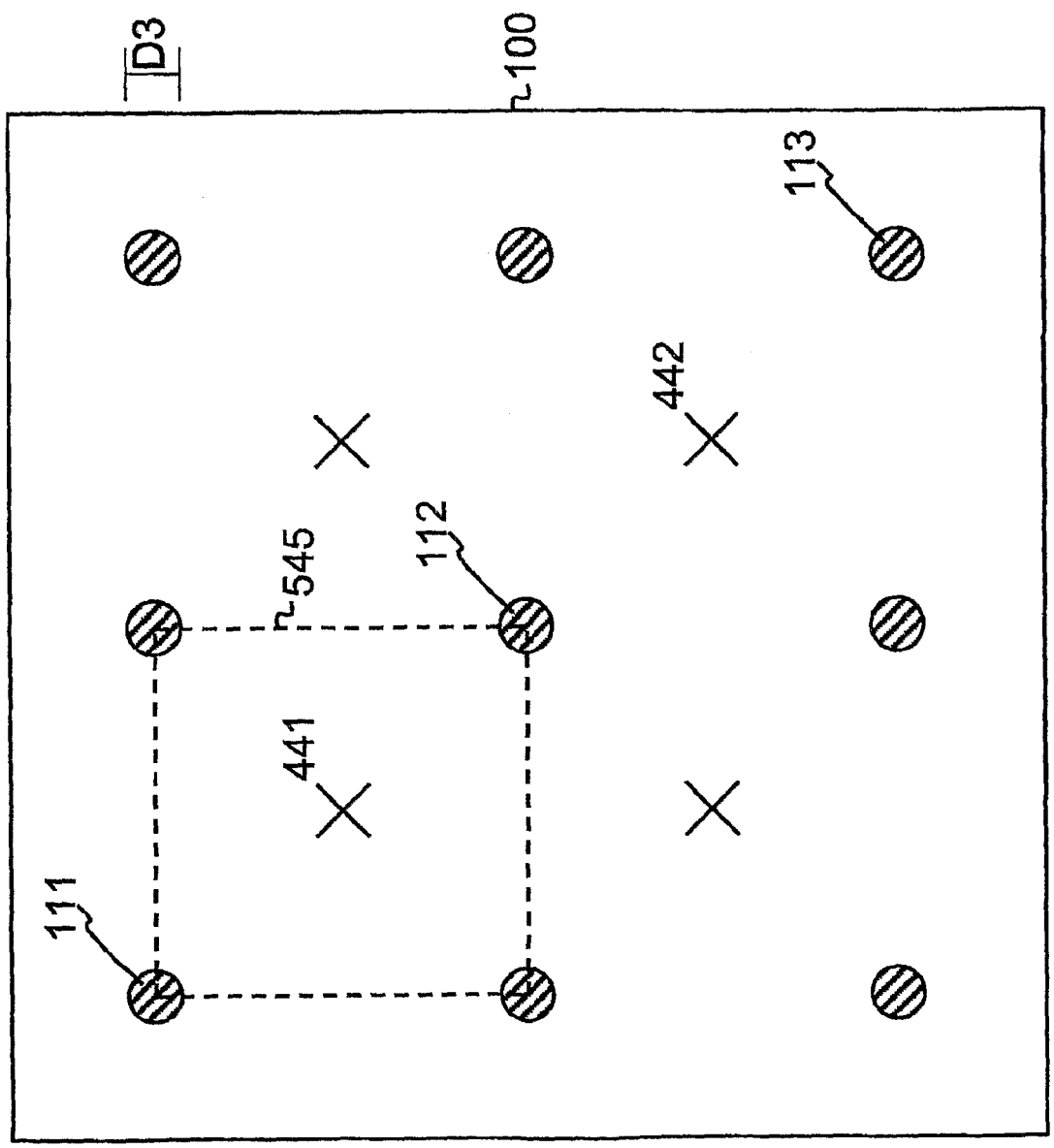
FIG. 5 illustrates a horizontal cross-section of the semiconductor apparatus presented in FIG. 1.

A horizontal cross-section of the radiation detector of FIG. 1 along the cut line 160 is presented by the FIG. 5. The broken line 545 illustrates the area of one pixel, i.e. all the first type signal charges generated by radiation in the depleted substrate inside the area presented by the broken line 545 are collected by the first contact belonging to this pixel. It is important that the following condition is fulfilled: on the horizontal plane 160 the net amount of second type doping atoms in the 3D structures should be bigger than the net amount of doping atoms of the first type in the substrate. It is beneficial that also the following condition is fulfilled: the net amount of second type doping atoms in the 3D structure should be bigger than the net amount of doping atoms of the first type in the substrate on the pixel area 545 belonging to the horizontal plane 160. The last condition means that every 3D structure has a non depleted part functioning as the current transporting resistive path. The first condition means that there exists a non depleted part functioning as the current transporting path at least in some 3D structures. The first and/or the last condition enable depletion of the substrate with a relatively small voltage, separation of signal and secondary charges, formation of the resistive path and formation of a signal charge collecting location 441, 442. The formation of the essentially constant vertical electric field component which transports signal charges collected at the signal charge collecting location 441, 442 is enabled by the current running between the front surface and the back surface through the resistive path. The non depleted areas inside the 3D structures 111, 112 and 113 correspond to the straight parts of the electron potential energy diagram in FIG. 4C.

From FIG. 5 one can easily deduce that at least three cylindrical 3D structures are needed in order to create the signal charge transporting potential energy minimum 441, 442 location between the 3D structures on a horizontal plane. In case of FIG. 9 only one 3D structure is required.

FIGS. 6A, 6B, 6D-6F illustrate different embodiments of the invention corresponding to a semiconductor radiation detector having a 3D structure formed of second type semiconductor material. The detector in FIG. 6A is the same than the detector in FIG. 1 except that there is a gap between the second electrode 606 and the 3D structure and between the third electrode 605 and the 3D structure. The detector in FIG. 6B has a first type third contact 607. In this detector the second type current running through the 3D structure is created by avalanche break down mechanism at the junction of the first type third contact and the second type 3D structure. Between the first type first contact 103 and the first type third contact 607 there may be an optional second type contact which preferably surrounds the first contact 103 and which is preferably reverse biased compared to both the first contact 103 and the third contact 607 thus isolating the first contact 103 and the third contact 607. If the first type substrate semiconductor material is p type and if it is covered by a positively charged isolator material, isolation can be provided by an electron inversion layer surrounding the first contact 103. There may be also several guard rings of the first and/or of the second type surrounding the first contact 103. FIGS. 6D-6F illustrate the situation wherein the length D2 of the 3D structure is smaller than the first vertical distance D1, i.e. the length of the 3D structure 614, 615, 616 is less than the substrate thickness. In the detector of FIG. 6D a breakdown current is created at the tip of the 3D structure. In the embodiments 1 and 6A-6F the at least one resistive path is provided by 3D structures and the signal charge transporting path is located inside the substrate. In afore said embodiments current is running inside the second type semiconductor material forming the 3D structures.

In the detectors of FIGS. 6A, 6B, 6D-6F a substantial amount of leakage current may be generated at the substrate and 3D structure interface which mixes with signal charges if the 3D semiconductor material is polycrystalline or if the substrate semiconductor material and the 3D semiconductor material are not lattice matched. In the detector of FIG. 6C a second type layer 623 is processed to the wall of a 3D hole before the hole is filled with first type semiconductor material 613. The second type layer 623 and the first type semiconductor material 613 form together the 3D structure. The second type layer 623 should contain more second type doping atoms than the substrate contains first type doping atoms on a horizontal cross-section of the detector. This enables a low substrate depletion voltage, separation of signal and secondary charges and the formation of the signal charge transporting path inside the substrate. The net amount of first type doping atoms inside the semiconductor material 613 should be bigger than the net amount second type doping atoms in the second type layer 623 and in the substrate on a horizontal cross-section of the detector. This enables the second type layer 623 to be fully depleted while a non depleted volume forming the resistive path is still maintained inside the semiconductor material 613. Preferably afore mentioned conditions should also apply to the area corresponding to one pixel situated on the horizontal cross-section. The first type current running in the first type semiconductor material 613 between the third contact 608 and the second contact 106 is created by breakdown preferably at the location where the first type semiconductor material 613 and the second type second contact 106 meet. In this case the second type layer 623 is practically completely depleted and it carries only a small second type current which is generated along the interface of the second type layer 623 and the first type semiconductor material and/or which is generated by radiation. The first type semiconductor material 613 could of course be replaced by a second type semiconductor material 112, but this would correspond to the case of FIG. 1.

The electron potential diagram on the line 650 is illustrated in FIG. 16A. In this case the substrate 100 is of p type, the second type layer 623 is of n type and the first type semiconductor material 613 is of p type. The substrate and the second type layer 623 are fully depleted. The first type semiconductor material 613 provides the resistive path, i.e. first type current runs between the second contact on the back surface and the third contact on the front surface through the first type semiconductor material 613. In this embodiment both the signal charges and the current running in the 3D structure are of the first type. The signal charge holes will be transported in the hole potential energy minima 1641, 1642 which form the signal charge transporting path between the front surface and the back surface.

FIGS. 7A-7H illustrate different embodiments of the invention corresponding to a semiconductor radiation detector where the 3D structure comprises isolator material 712, 714, 715, 716, that is preferably positively charged. In the embodiments of the FIGS. 7A, 7B, 7D-7F the substrate is preferably p type. In these cases the positively charged isolator material should contain more positive charges than the substrate contains p type doping atoms on a horizontal cross-section of the detector. Preferably afore said condition should apply also to the area corresponding to one pixel on the horizontal cross-section of the detector. This enables a low substrate depletion voltage, separation of signal and secondary charges and the formation of a signal charge transporting path in the depleted substrate. The resistive path is formed at the semiconductor isolator interface. In addition the positively charged isolator material should beneficially contain enough of positive charges in order to maintain an inversion layer of electrons at the substrate and isolator material interface. This is a beneficial but not a mandatory condition. In these embodiments the 3D structure is formed of the positively charged isolator material and of the possible inversion layer. In case the inversion layer is present it forms the resistive path of the 3D structure. An electron current is running at the semiconductor isolator interface beneficially in an inversion layer between the second type second contact and the third contact creating the essentially constant vertical electric field component. An example of the positively charged isolator material and p type substrate configuration is a positively charged silicon dioxide 3D structure in a p type silicon substrate.

In FIGS. 7A, 7E, 7F and 7G the third contact (105, 605) is of second type. In FIGS. 7B and 7D the third contact (607) is of first type and the current running at the semiconductor isolator interface (preferably in an inversion layer) is provided by break down mechanism. The first type third contact (607) is preferably made inside a second type doping or the first type first contact is surrounded by a second type guard ring. In FIG. 7B the break down takes place at a location between the third contact and the 3D structure at the front surface and in FIG. 7D the break down takes place at the tip or close to the tip of the 3D structure. The FIGS. 7D-7F illustrate the situation where the length D2 of the 3D structure 714, 715, 716 is less than the substrate thickness.

FIG. 7C illustrates an embodiment of the invention corresponding to a semiconductor radiation detector where the 3D structure comprises positively charged isolator material and the substrate is n type. Between the n type substrate and the isolator material there is a semiconductor layer 623 which is in this case p type. The semiconductor layer 623 should contain more p type doping atoms than the substrate contains n type doping atoms on a horizontal cross-section of the detector. Preferably the semiconductor layer 623 should contain more p type doping atoms than the substrate contains n type doping atoms on an area corresponding to one pixel on the horizontal cross-section of the detector. This enables a low substrate depletion voltage, separation of the signal and secondary charges and the formation of the signal charge (i.e. electrons) transporting path inside the fully depleted substrate. If the layer 623 is depleted during operation and if an inversion layer (composed of electrons) still exists on the surface of the isolator material, the break down current generation will happen at a location between isolator material 712 and the second type second contact (106) on the back surface. A first type current (i.e. an electron current) will thus be transported in the inversion layer which forms in this case the resistive path. If the surface of the insulator material is depleted and if the semiconductor layer 623 is non depleted, the electric break down will happen between the first type third contact (607) and the second type semiconductor layer 623 on the front surface. In this case the non depleted second type semiconductor layer 623 forms the resistive path which transports a second type current (i.e. a hole current).

If the positively charged isolator material 712 contains less positive charges than the substrate contains p type doping atoms on a horizontal cross-section of the detector the configuration of FIG. 7G can be used. In this case the net sum of the positive charges in the isolator material 712 and of the n type doping atoms in the semiconductor layer 623 is higher than the amount of p type doping atoms in the substrate on a horizontal plane and preferably on an area corresponding to one pixel on the horizontal plane. This enables a low substrate depletion voltage, separation of signal and secondary charges and the formation of the signal charge transporting path inside the substrate. In operation a second type current runs between the second type second contact and the second type third contact beneficially in an accumulation layer which may exist between the second type semiconductor layer 623 and the positively charged isolator material 712. If the second type semiconductor layer 623 is in operation not completely depleted the second type current runs also in the second type semiconductor layer 623. In this embodiment the 3D structure is formed of the positively charged isolator material 712, of the second type semiconductor layer 623 and of the possible accumulation layer. The resistive path is formed at the semiconductor isolator material interface. Beneficially the resistive path comprises also an accumulation layer. The resistive path may also comprise a non depleted part of the semiconductor layer 623.

The embodiment of FIG. 7H resembles the embodiment of FIG. 7C. In the detector of FIG. 7H a second type fourth contact 709 on the back surface of the detector collects the secondary charges. In operation the current will run between the first type second contact 706 on the back surface and the first type third contact 607 on the front surface preferably in an inversion layer at the interface of the second type semiconductor layer 623 and the positively charged isolator layer 712. The second type semiconductor layer 623 will be completely depleted during operation. The resistive path is thus provided at the semiconductor layer 623 isolator layer 712 interface and it comprises beneficially also an inversion layer. The signal charge transporting path exists in the depleted substrate. The difference between the devices of FIGS. 7C and 7H is that in the device of FIG. 7H the current running in the 3D structure is provided by the first type second contact 706 and not by electric break down mechanism.

The embodiment of FIG. 7I corresponds to the embodiment of FIG. 7G with the exception that the positively charged isolator material 712 is missing. The 3D hole 717 and the 3D hole—semiconductor interface in FIG. 7G is also a part of the 3D structure. The interface of such a 3D hole can provide the resistive path or part of the resistive path of the 3D structure. Embodiments where the positively charged isolator material is missing could also be formed of the structures presented in FIGS. 7C, 7G and 7H. If the surface properties between the substrate and vacuum (or air, gas, liquid etc.) are proper, i.e. if there are more positive or negative charges corresponding to this surface than opposite type doping atoms in the substrate on a horizontal cross-section of the semiconductor apparatus, the isolator material 712 can be removed from the embodiments 7A, 7B, 7D-7F. In this case the resistive path is formed at the 3D hole substrate interface and the signal charge transporting path is formed in the depleted substrate. The 3D hole can be used to provide a path for coolant material like for example for inert gas. The isolator material 712 could also be negatively charged and in this case the doping types in the embodiments of FIGS. 7A-7I are reversed. For example the substrate in FIG. 7A would be n type.

In the embodiment of FIG. 8A the 3D structure comprises resistive material 812 and an optional isolator layer 831 between the resistive material 812 and the substrate. A third contact 805 is connected on the front surface and a second contact 806 is connected on the back surface to the resistive material 812. In operation a current will be running between the third and the second contacts inside the resistive material in order to create the essentially constant vertical electric field component, i.e. the resistive material forms the resistive path. On the front surface there is an optional second type contact 808 and on the back surface there is a second type fourth contact 709 collecting the secondary charges. In operation the device is biased such that the substrate is fully depleted and that a signal charge transporting path is formed inside the substrate. In one bias scheme the device is biased such that an inversion layer is formed at the substrate and isolator layer 831 interface and such that there is running a second type current in the inversion layer between the second type fourth contact 709 and the optional second type contact 808, i.e. there exists an additional resistive path at the substrate isolator material interface.

The embodiment of FIG. 8B is the same than the embodiment of FIG. 8A except that there is an optional contact 807 of first type. In operation a current will be running between the third contact 805 and the second contact 806 in the resistive path provided by the resistive material 812 in order to create the essentially constant vertical electric field component. In operation the device is biased such that the substrate is fully depleted and that a signal charge transporting path is formed inside the substrate. In one bias scheme the device is biased such that electric break down takes place at the location where the optional first type contact 807 and the isolator layer 831 meet providing second type current running at the substrate and isolator layer 831 interface between the second type fourth contact 709 and the first type optional contact 807. There may also be an inversion layer at the substrate and isolator layer 831 interface.

In the embodiment of FIG. 8C the second type layer 623 is completely depleted and there is preferably no electric break down, i.e. the interface of the second type layer 623 and the isolator layer 831 is depleted. The resistive path in the embodiment of FIG. 8C is provided by the resistive material 812 and in operation the device is biased such that the substrate is fully depleted and that a signal charge transporting path is formed inside the depleted substrate. The resistive material 812 in the embodiments of FIGS. 8A-8C may be composed for example of a badly conducting metal composition. The optional isolator layer 831 in the embodiments of 8A-8C prevents current flow from the resistive material to the depleted substrate.

FIGS. 10A and 10B represent less advantageous devices since the third contact on the front surface is missing. There should be more of second type doping atoms and/or of second type fixed charges in the 3D structure than first type doping atoms on a horizontal plane and beneficially on the pixel area on the horizontal plane. In these cases substrate is fully depleted and electric break down will occur on the front surface between the first contact 103 and the 3D structure formed of the positively charged insulator material 712 or of the second type material 112. This means that the first contact will collect the current running through the high resistive path provided by the 3D structure. This current will thus mix with the signal charge increasing noise in the device.

Figure 11B:
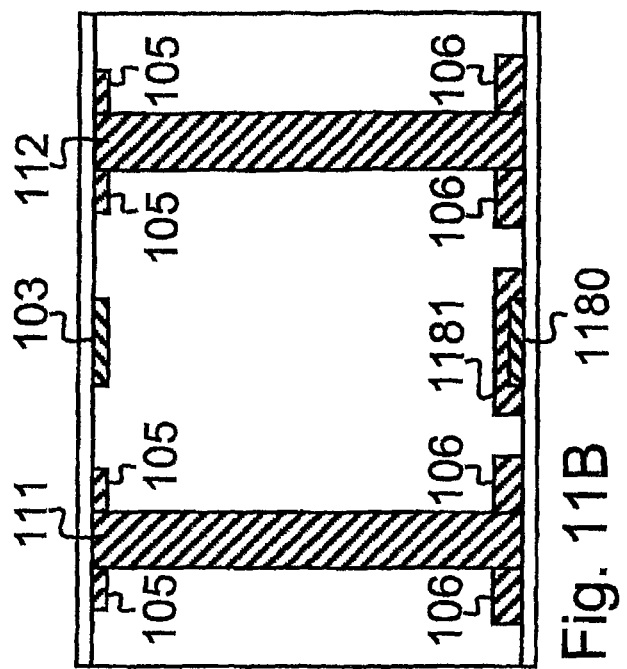
FIGS. 11A and 11B illustrate embodiments of the semiconductor apparatus according to the present invention.
Figure 11A:
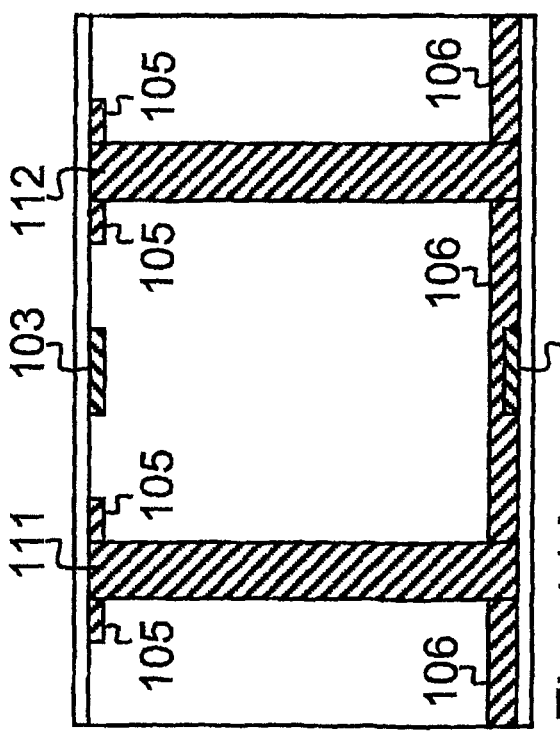

The embodiment of FIG. 11A can be used in power electronics. The resistive path is provided by the semiconductor material 111, 112 forming the 3D structures. There should be more second type doping atoms in the 3D structure than first type doping atoms in the substrate on a horizontal cross-section of the device; preferably the afore said condition should be full filled on an area corresponding to one pixel on the horizontal cross-section. In this manner the first type substrate can be fully depleted with a low voltage, signal and secondary charges can be separated, a signal charge transporting path is formed inside the depleted substrate and a resistive path is formed inside the 3D structure. In the present embodiment a fifth contact 1180 on the back surface of the device provides the signal charges. By modulating the potential of the fifth contact which is in this case a first type doping information and/or power pulses can be delivered from the second surface to the first surface. More precisely said, in the embodiment of FIG. 11A the fifth contact 1180 on the back surface provides first type current pulses which are transported in the signal charge transporting path existing in the substrate and which are collected by the first contact 103 on the front surface. The first type current and the first type charges refer in this case to signal current and to signal charges. The secondary charges refer in this case to second type charges generated in the depleted semiconductor material and at depleted semiconductor interfaces.

The power device embodiment of FIG. 11A is essentially a novel bipolar junction transistor (BJT), where the first contact 103 corresponds to the collector and the fifth contact 1180 corresponds to the emitter. The third contact 105 is a new common fourth node of the novel BJT collecting the current running in the resistive path. The second contact 160 corresponds to a common base shared possibly by many other novel BJT according to the invention. Besides being a common base the second contact 160 provides also current for the resistive path. These two functions of the second contact 160 may also be separated. This is presented in FIG. 11B where there are five nodes altogether. The first type fifth contact 1180 corresponds to the emitter node of one pixel, the second type doping 1181 corresponds to the base node of one pixel, the first type first contact 103 corresponds to the collector node of one pixel, the second type third contact 105 corresponds to an additional common fourth node and the second type second contact 106 corresponds to an additional fifth node of the novel BJT. The embodiment of FIG. 11B results in more operational flexibility and higher signal amplification but more elaborate manufacturing and more leakage current generated at the depleted interface between the second type second contact 106 and the second type base node 1181. There may be one or more first or second type guard rings between the second contact 106 and the base node 1181.

In normal power bipolar transistors the collector voltage is limited by the maximum electric field value present at the base collector interface. This is not the case in the power bipolar transistor embodiments presented in FIGS. 11A and 11B where the collector voltage is only limited by the thickness of the device which can be as thick as desired. Another advantage is that the collector voltage has almost no effect on the base width, i.e. the early voltage of the novel BJT is very small. Yet another advantage of the semiconductor power device embodiments of FIGS. 11A and 11B is that horizontal spreading of the signal charge is prevented. Thus the distance between adjacent power devices on the same chip may be much smaller than in planar power chips.

It is self evident that any of the 3D structures presented in this document can be used in the power device embodiments instead of the 3D structures presented in FIGS. 11A and 11B.

To a person skilled in the art it is also clear that the invention can be incorporated also to other power devices besides the BJT. The power devices according to the present invention withstand very high voltages and they can thus replace for example vacuum tubes in many applications.

Figure 12:
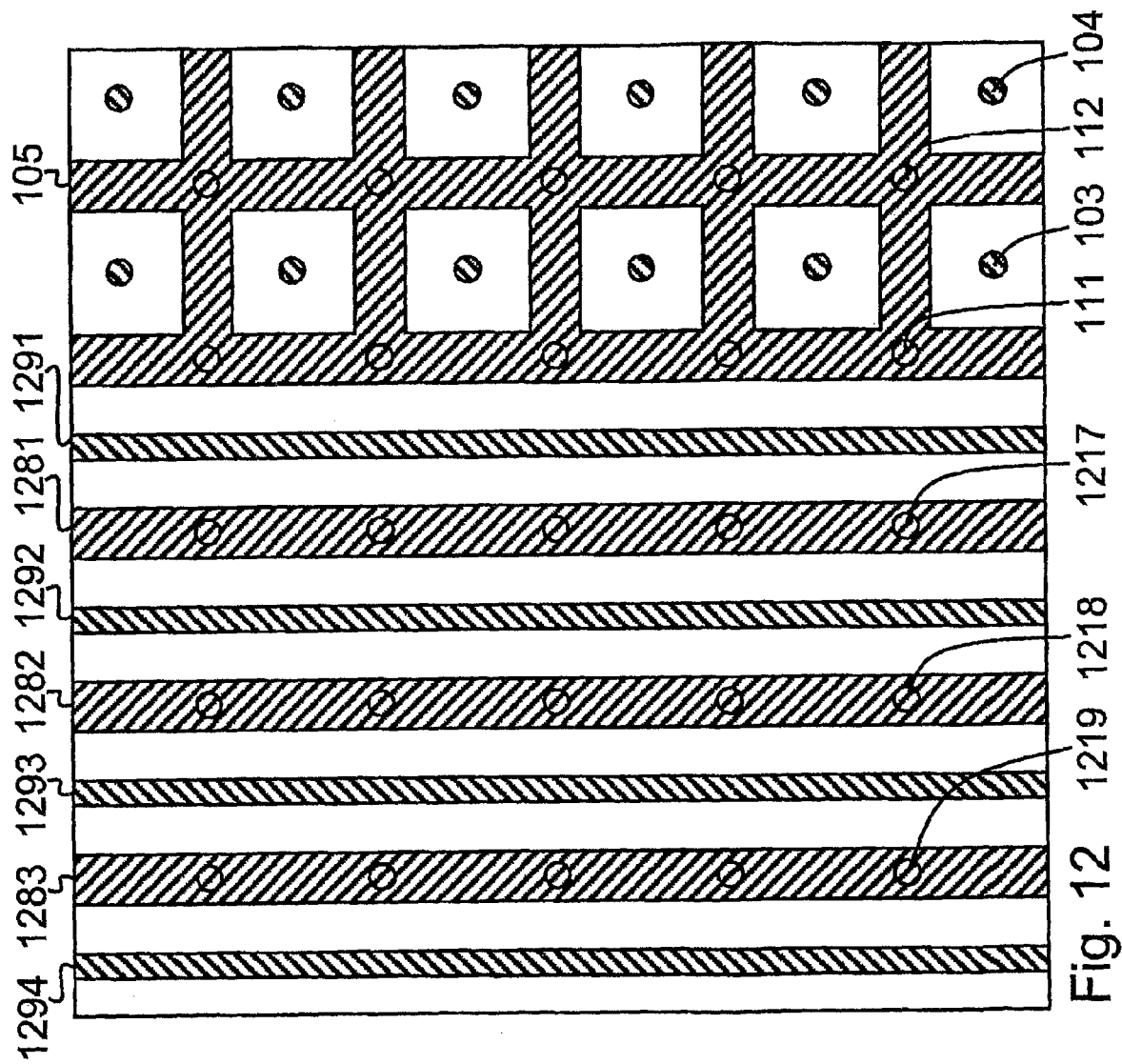
FIG. 12 illustrates an embodiment of the invention comprising guard rings around the active area of the device.

FIG. 12 illustrates the front surface of an embodiment comprising guard structures which surround the active area, i.e. the area containing the pixels. The 3D structures 111, 112, the third contact 105 of the 3D structures 111, 112 and the first contacts 103, 104 of the first type belong to the active area. The guard rings 1281, 1282, 1283 of the second type are coupled to 3D structures 1217, 1218 and 1219. The guard ring 1281 of the second type acts as the third contact for the 3D structure 1217, the guard ring 1282 of the second type acts as the third contact for the 3D structure 1218 and the guard ring 1283 of the second type acts as the third contact for the 3D structure 1219. The optional guard rings 1291, 1292, 1293, 1294 of the first type are used to isolate the guard rings 1281, 1282, 1283 of the second type.

In operation the device can be biased for example in the following manner in case the first type is p type and the second type is n type. The first contact 103 on the front surface is connected to ground potential, third contact 105 on the front surface is connected to a small potential and the second contact on the back surface is connected to a high potential. In order for the potential to change smoothly towards the edge of the chip, the guard ring 1281 is connected to a higher potential than the third contact 105, the guard ring 1282 is connected to a higher potential than the guard ring 1281 and the guard ring 1283 is connected to a higher potential than the guard ring 1282. This procedure is applied until the chip edge is reached. The guard ring of the second type next to the chip edge and a substrate contact between this guard ring and the chip edge are preferably connected to the same potential than the second contact on the back surface of the substrate. The guard rings closest to the chip edge may not be coupled to 3D structures. The optional guard rings 1291, 1292, 1293, 1294 of the first type are preferably reverse biased compared to adjacent guard rings of the second type and to the third contact 105. For example the optional guard ring 1292 is preferably reverse biased compared to both guard rings 1281 and 1282. The optional guard ring 1293 may be biased at the same potential than the guard ring 1281 and the guard ring 1294 may be biased at the same potential than the guard ring 1282. The biasing of the guard rings and of the optional guards ring may be accomplished for instance by a resistive chain. The guard rings and/or the optional guard rings may, however, be also floating.

There may be also additional guard rings of the first and/or second type between the guard rings 1281, 1282, 1283 of the second type the guard rings 1281, 1282, 1283 being coupled to 3D structures. These additional guard rings may be biased or floating. Such additional guard rings of the first and/or second type may also surround the first contact on the front surface and they may be biased or floating.

Figure 13:
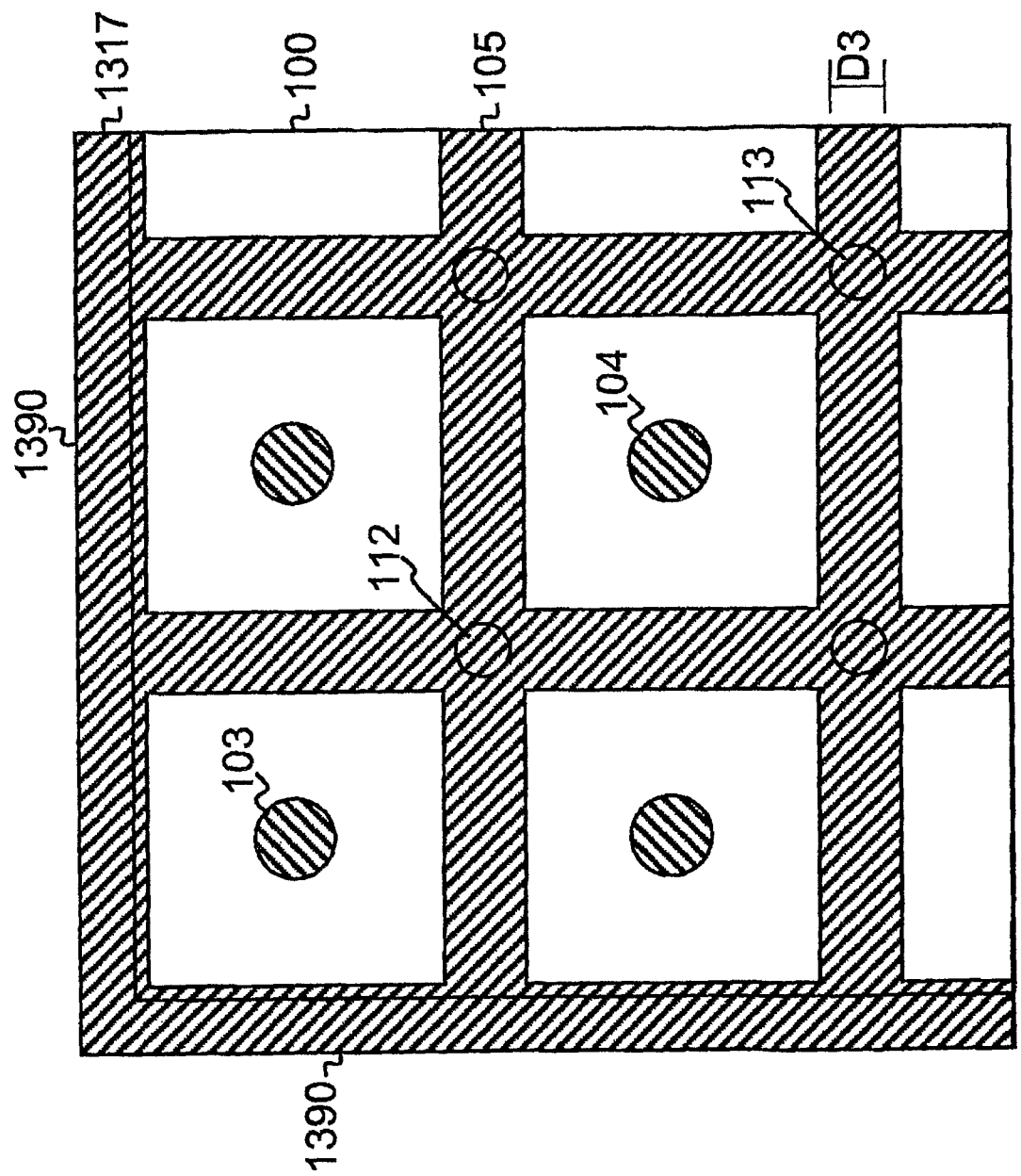
FIG. 13 illustrates an edgeless embodiment of the invention comprising only one three dimensional guard structure around the active area of the device.
Figure 14:
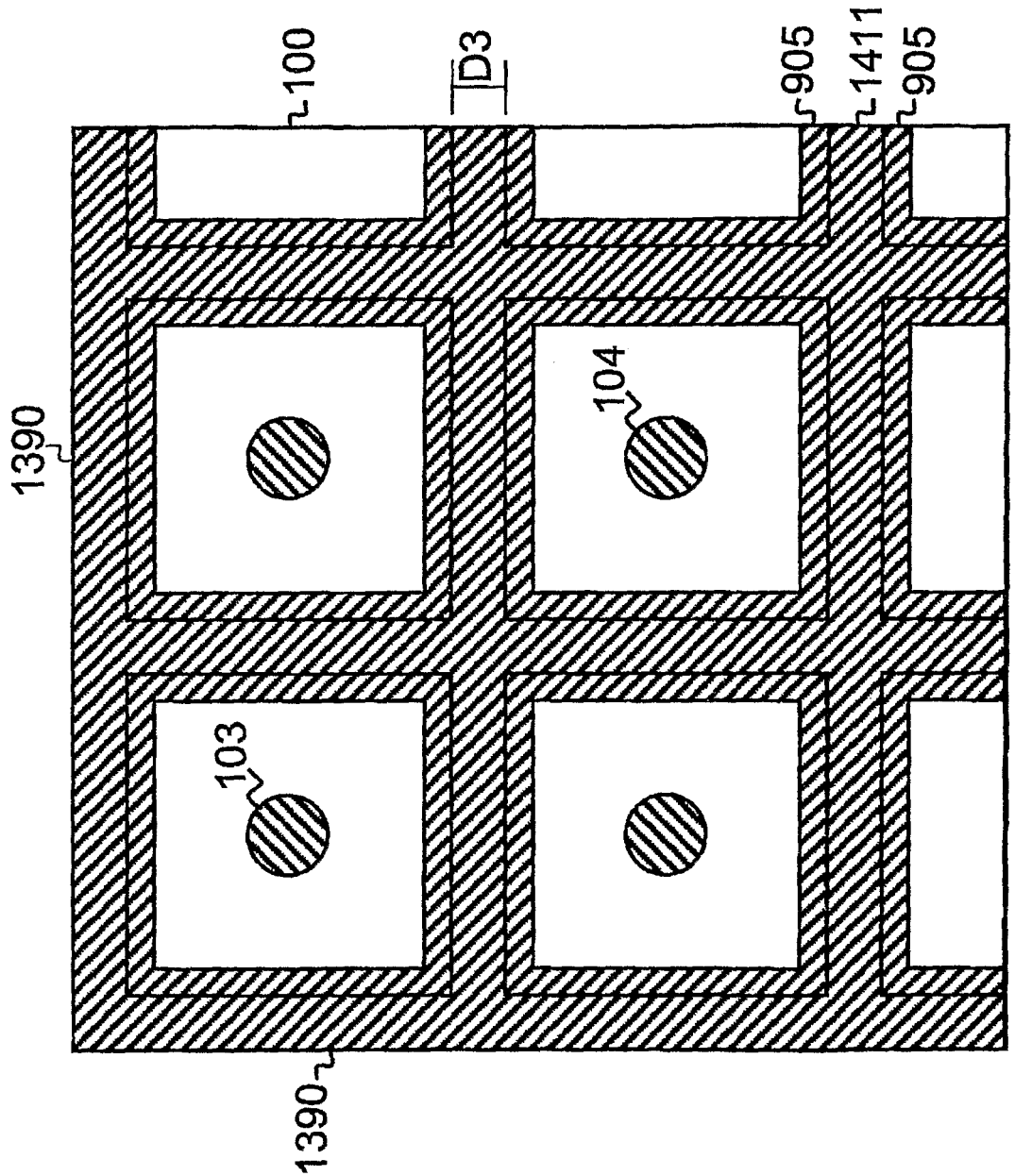
FIG. 14 illustrates an edgeless embodiment of the invention comprising a net like three dimensional structure.

One should note that there may be guard rings on the back surface and/or on the front surface. The benefit of having guard rings only on the front surface is that only one sided processing is required in case of the radiation detector. The guard rings can also be replaced by an edgeless structure which is also known as active edge. Such embodiments are presented in FIGS. 13 and 14. In the embodiment of FIG. 13 there is an additional 3D structure 1317 on the edge of the device surrounding the active area of the detector. In FIG. 14 the net like 3D structure 1411 ends abruptly. In both structures the chip edge 1390 has been created for instance by sawing, cleaving, etching or cutting. The chip edge 1390 is likely to have a lot of process generated damage, i.e. the chip edge 1390 is likely to have a lot of recombination centers which increase the current running through the 3D structure next to the chip edge unless the chip edge is well passivated. If this is not the case the power consumption of the semiconductor device is increased considerably. An example of an edgeless 3D semiconductor device is presented in C. Kenney, S. Parker, J. Segal, C. Storment, IEEE Transactions on Nuclear Science NS-46 (4) (1999) 1224.

In the embodiments of FIG. 15A the 3D structure comprises an isolator layer 1511 which does not completely fill the 3D structure, i.e. there is an empty space inside the 3D structure. In addition the 3D structure comprises an optional second type layer 623. In operation the substrate is fully depleted and the depleted substrate provides the signal charge transporting path. The resistive path is provided by the isolator semiconductor interface and by the optional second type layer 623. The embodiment of FIG. 15B comprises resistive material 1512 which does not completely fill the 3D structure. As result there is an empty space inside the 3D structure. In the embodiment of 15B the resistive path is provided by the resistive material 1512. In operation the substrate is fully depleted and the signal charge transporting path is provided inside the depleted substrate. It is self evident that the empty space of embodiments 15A, 15B and 7I can be further filled with suitable material. There may also be several empty and/or filled spaces inside the 3D structures. The empty space in the 3D structure can be used for providing a path for coolant material. Cooling of the semiconductor apparatus may be important due to the fact that it is heated by the current flowing through the resistive path. By creating a flow of suitable coolant material through the hole cooling is provided. The suitable coolant material may be for example inert gas or liquid.

In the embodiment of FIG. 15C the 3D structure is composed of a multitude of objects 1514, 1515, 1516, 1517 which are in this case sphere shaped. The 3D structure of the embodiment can be defined in the following way. The minimum distance between two objects 1516, 1517 is D5; this segment of line is also depicted in FIG. 15C. The sum of the minimum distances between the adjacent objects is S1. The distance D4 between the end points of two adjacent minimum distance segments of lines and the corresponding segment of line is depicted in FIG. 15C. The sum of the distances between the end points of two adjacent minimum distance segment of lines is S2. The inequality $W=S2/(S1+S2)>0.1$ should hold. Beneficially the inequalities $W>0.2$, $W>0.3$, $W>0.4$, $W>0.5$, $W>0.6$, $W>0.7$, $W>0.8$, $W>0.9$ should also hold. The inequalities are listed in order of beneficiality wherein the last inequality is the most beneficial one. If any of the inequalities hold the multitudes of objects 1514, 1515, 1516, 1517 are defined to form a 3D structure having a vertical length D2 between the first object 1514 and the last object 1517. If the 3D structure provides the resistive path between the front surface and the back surface the resistivity along one object 1514, 1515, 1516, 1517 and along an adjacent minimum distance line (D5) should be essentially the same than along a similar path at a different location of the 3D structure. In this manner an essentially constant vertical electric field component can be formed inside the semiconductor apparatus. The embodiment of FIG. 15C may have the following operation principle: the substrate is fully depleted, a signal charge transporting path is provided inside the substrate and the resistive path is provided by the multitude of objects 1514-1517. In this case there should be more of the second type doping atoms in the 3D structure than first type atoms in the substrate on an average horizontal cross-section of the device between the first 1514 and the last 1517 object. This should beneficially apply to the area belonging to one pixel on the horizontal cross-section. Manufacturing of the type of 3D structure presented in FIG. 15C is described in US 2004/0038527 A1.

In the embodiment of FIG. 15D the substrate 1500 is of second conductivity type. The first type layer 1523 and the second type semiconductor material 1513 form together the 3D structure. The second type semiconductor material 1513 provides the resistive path through which the second type current runs between the third contact 608 on the front surface and the second contact 106 on the back surface. Accordingly an essentially constant vertical electric field component is created inside the semiconductor apparatus. In operation the substrate and the first type layer 1523 are fully depleted. The signal charges will be, however, transported towards the front surface inside the first type layer 1523 and not inside the substrate 1500, i.e. the layer 1523 forms the signal charge transporting path. On the front surface the signal charges are collected by the first contact 103 which is of the first type. Secondary charges, i.e. charges of the second type, which are generated inside the substrate, are transported inside the substrate towards the second type second contact 106 on the back surface. The optional second type second contact 1507 surrounds the first contact 103 and isolates it from other first contacts collecting signal charge. There might also be inside the substrate an additional resistive path between the optional second type contact 1507 on the front surface and the second type second contact 106 on the back surface. The first type layer 1523 should contain more doping atoms of the first type than the second type substrate contains second type doping atoms on a horizontal cross-section of the device. The second type semiconductor material 1513 should contain more second type doping atoms than the difference between first type doping atoms in the first type layer 1523 and second type doping atoms in the substrate. Afore said conditions should also apply to the area of one pixel on the horizontal cross-section of the device. In this manner the second type substrate and the first type layer 1523 can be depleted with a low voltage, signal charges and secondary charges are separated and a signal charge transporting path is formed inside the first type layer 1523.

The electron potential diagram on the line 1550 is presented in FIG. 16B in case the first type semiconductor material is of n type and the second type semiconductor material is of p type. The signal charge electrons are in this case transported inside the first type layer 1523 in the electron potential energy minimum 1643 which forms the signal charge transporting path.

In the embodiment of FIG. 15E the resistive path (1645) between the second contact 106 on the back surface and the third contact 1505 on the front surface is situated inside the substrate 1500. The second type current running through the resistive path provided by the second type substrate creates the essentially constant vertical electric field inside the semiconductor apparatus. In operation the signal charges are transported inside the fully depleted first type 3D structure 1514 towards the first type first contact 103 on the front surface, i.e. the 3D structure 1514 provides the signal charge transporting path. The full depletion of the 3D structure and the formation of the resistive path inside the substrate necessitate that on a horizontal plane the net amount of second type doping atoms in the second type substrate is larger than the net amount of first type doping atoms and/or first type fixed charge (e.g. fixed charge like the positive oxide charge). Beneficially, the net amount of second type doping atoms in the substrate should be larger than the net amount of first type doping atoms and/or first type fixed charges on a horizontal area belonging to one pixel. The third contact 1505 surrounds beneficially the first contact 103 isolating it thus from other first contacts. The resistive path exists in the embodiment between the front surface and the back surface through out the substrate thickness which is in this embodiment larger than the length D2 of the 3D structure.

The electron potential diagram on the line 1551 is presented in FIG. 16C in case the first type semiconductor material is of n type and the second type semiconductor material is of p type. The signal charges are trans-ported inside the first type 3D structure 1514 in the electron potential energy minimum 1644 which forms the signal charge transporting path. The flat section 1645 of the electron potential diagram corresponds to the resistive path inside the substrate 1500. The flat section 1645 is neutral due to second type current, i.e. due to secondary charges, running inside the second type substrate. The resistive path 1645 existing between the front surface and the back surface is parallel to the 3D structure.

It should be noted, that even though the resistive path between the third contact on the front surface and the second contact on the back surface is provided by the substrate, the 3D structure is vital for the invention. This is due to the fact that with the help of the 3D structures a horizontal electric field component is created which separates signal and secondary charges, i.e. the current running in the substrate and the signal charges transported inside the signal charge transporting paths provided by the 3D structures are separated. If there were no 3D structures, the signal charges would not be separated from secondary charges and the signal charges would recombine with the current running inside the substrate. The 3D structures also limit the horizontal area (1645) of current path to a fraction of the total horizontal area of the substrate which increases the resistance and decreases the power consumption considerably. The 3D structures provide an additional benefit for all of the embodiments, namely, horizontal spreading of the signal charge is prevented which enables good spatial resolution. This is not the case in thick planar semiconductor detectors, i.e. the signal charges spread freely in the horizontal directions.

In semiconductor radiation detectors a thick depleted semiconductor substrate provides good stopping power for radiation. However, signal charges may be transported long distances inside the semiconductor radiation detector before they are collected at the front surface. The holes are for instance in silicon less prone to trapping than the electrons. Accordingly there is a benefit when holes are used as signal charges. On the other hand the electrons have typically much higher mobility than the holes. Thus in terms of signal charge collection speed it is favourable to use electrons as signal charges. In terms of power consumption it is more favourable to use hole current running through the resistive path existing between the front surface and the back surface than electron current due to the typically lower hole mobility. If a single X ray image is taken it may be beneficial to use holes as signal charges due to lower trapping tendency. However, in case of continuous X-ray imaging it may be beneficial to use electrons as signal charges especially if fast moving objects are analyzed. In power electronics it would be beneficial to use electrons as signal charges and hole current for the current running through the high resistive path existing between the front surface and the back surface. This arrangement provides low power consumption and fast signal charge transport between the front surface and the back surface of the semiconductor apparatus.

One should realize that it is desirable to have high resistance for the current path existing between the front surface and the back surface to reduce the power consumption of the semiconductor apparatus. If the current running through the resistive path existing between the front and the back surface is composed of electrons the electron mobility should be beneficially as low as possible. Correspondingly, if the current running through the resistive path existing between the front and back surface is composed of electrons the hole mobility should be beneficially as low as possible. The mobility of the 3D structure may be reduced and other properties may be tailored for instance by manufacturing the 3D structure or a layer belonging to the 3D structure from a suitable tailored compound semiconductor material. Such a tailored semiconductor material may be composed of many different elements (for example of two, of three, of four, of five or of six different elements). If the resistive path comprises an inversion layer or an accumulation layer the mobility of the current carriers (holes or electrons) running in the resistive path should be as low as possible. This can be achieved for instance by proper process conditions.

Beside the mobility also the mean free path is important. The mean free path should not be too long. Otherwise the current carriers can acquire enough of energy to create electron hole pairs. As a result of this noise may be generated in the semiconductor apparatus. The energy gained on the mean free path should thus be well below the ionization energy of the electron hole pair so that no avalanche current generation takes place. This poses limitations to the size of the electric field, i.e. to the parameter: voltage difference between the front surface and the back surface devided by the thickness of the semiconductor apparatus.

The semiconductor apparatus according to the invention may contain e.g. CMOS (Complementary Metal Oxide Semiconductor) circuitry on the front surface and/or on the back surface. Such CMOS circuitry may perform various different tasks like read out, pixel selection, memory, out put, input etc. The first contact on the front surface may be connected for example to the gate of a source follower transistor. The signal charges may also be collected to a modified internal gate (MIG) situated on the front surface inside the semiconductor before they are drained to the first contact on the front surface, i.e. the 3D detector according to the invention may contain MIG structures invented by the inventor. There may also be analogue electronics like bipolar transistors, capacitors, resistor, etc. on either/or both surfaces of the device. It should be noted that the first, second, third and/or fourth contact may be metal contacts of resistive or Shotky type, i.e. the contacts do not have to be doped semiconductor regions of the first or second type.

The front surface and/or the back surface of the semiconductor apparatus according to the invention may also be bonded to input and/or to output chips. There may be one or several input or output chips. In a semiconductor radiation detector according to the invention the first contacts on the front surface may be contacted for example to a read out chip. In a power device the fifth contacts on the back surface may for example be bonded to an input chip and/or the first contact on the front surface may be contacted to an output chip. The back surface of the power device may be at ground potential and the power device may comprise many corresponding input/output channels. Thus many different signals and/or power pulses may be transported through the power device and the power device may have many outputs connected to different devices. An advantage of the power device embodiment is that different input/output channels can be close to each others, i.e. the packing density compared to the planar power devices is increased. There may also be additional chips connected to the invented semiconductor apparatus and the additional chips may contain e.g. memory, microprocessors etc. The invented semiconductor apparatus may also be connected to a display and/or printer.

The length $D2$ of the 3D structure is preferably more than 5 μm. Inequalities can be listed in order of beneficiality $D2>10$ μm, $D2>20$ μm, $D2>50$ μm, $D2>100$ μm, wherein the last inequality is the most beneficial one. It is important to note that the 3D structure provides an important function which is common to all of the embodiments including the embodiment presented in FIG. 15E, i.e. it provides a horizontal electric field component which separates the signal and secondary charges and it provides a signal charge transporting path. More precisely said the current running between the front surface and the back surface through the resistive path and the signal charges running in the signal charge transporting path are separated which prevents recombination and/or mixing of the signal charges running in the signal charge transporting path with the current running through the resistive path.

Beneficially a 3D radiation detector according to the invention is back illuminated, i.e. the back surface receives the radiation. The 3D radiation detector according to the invention may, however, be also front illuminated. The isolator layer 120 on the back surface is optional and it may be replaced by a metal layer which can be for instance aluminium. If the 3D radiation detector according to the invention is used to detect for instance near infrared radiation and/or light the front and/or back surface may also comprise anti reflection layers. The back surface and/or the front surface may also contain transparent conductors. The 3D radiation detector according to the invention may be used as a night vision device. When a voltage difference is connected between the back surface and the front surface it is safer to ramp up the voltage difference steadily in a certain period of time. If the voltage difference between the front and the back surface is connected too abruptly problems may emerge.

It is important to note that the first type may refer to p or n type and that the second type refers to opposite doping. The p and n type areas in the FIGS. 4A-4C and 16A-16C can thus be interchanged. The 3D structures may also protrude into the substrate in different directions than the surface normal of the front surface and/or the back surface. In such a case the vertical direction is redefined to be parallel to the 3D structures and the horizontal directions are redefined to be perpendicular to the direction parallel to the 3D structures. This is due to the fact that the essentially constant signal charge transporting electric field component, the signal charge transporting path and the resistive path are parallel to the 3D structures. Generally speaking the 3D structure is parallel to a path subtending the first surface and the second surface; the 3D structure is defined to have a length $D2$ along afore said path and a smallest cross-section $D3$ being perpendicular to the length $D2$. The back surface is preferably parallel to the front surface but it may also be non parallel. The inversion and the accumulation layers are formed of a two dimensional electron or hole gas layer, i.e. they are not physical layers formed of atoms. The formation of the layers 623 and 1523 can be made for instance by diffusion. In the embodiments of FIGS. 6C, 7A-8C, 15A and 15D the mixing of signal charges and interface generation current can be reduced. In the manufacturing of the 3D structures any technology can be used (e.g. etching, laser ablation, drilling, etc).

The 3D structures according to the invention can not be 3D electrodes since electrodes have by definition a very high conductivity and since the potential inside an electrode is essentially constant. In the present invention the conductivity of the 3D structures should be low and there should be a potential gradient inside the 3D structure. If not impossible, the use of 3D electrodes instead of the described 3D structures would result in very high power consumption and considerable heating of the device. If the 3D structures according to the invention are formed of semiconductor material, the doping concentration of the 3D structures should be less than $10^{17}$ doping atoms per cubic centimeter unless the 3D structures are extraordinarily thin. The 3D structure may also be referred to as an elongated structure.

It will be obvious to a person skilled in the art that, as the technology advances, the inventive concept can be implemented in various ways. The invention and its embodiments are not limited to the examples described above but may vary within the scope of the claims.

The invention claimed is:

1. A semiconductor apparatus, comprising
a substrate, the substrate having a first horizontal surface, and an opposite second horizontal surface;
at least one elongated 3-dimensional structure that has a length along a path subtending the first horizontal surface and the second horizontal surface, the length being greater than a cross-section of the elongated 3-dimensional structure wherein the cross-section is perpendicular to said path;
a first horizontal collection contact electrode on the first horizontal surface;
a second horizontal contact electrode on the second horizontal surface;
a third horizontal contact electrode on the first horizontal surface;
a resistive path provided by the at least one elongated 3-dimensional structure between the third horizontal contact electrode on the first horizontal surface and the second horizontal contact electrode on the second horizontal surface;
a first bias between the third horizontal contact electrode and the first horizontal collection electrode for depleting semiconductor material in the semiconductor apparatus and creating, along the length of the at least one elongated 3-dimensional structure, an electric field component that drives signal charge carriers in a direction perpendicular to the path of the at least one elongated 3-dimensional structure;
a second bias between the third horizontal contact electrode on the first horizontal surface and the second horizontal contact electrode on the second horizontal surface for generating a current flow that creates, within the depleted semiconductor material, a constant electric field component that drives signal charge carriers in the depleted semiconductor material in a direction towards the first horizontal collection contact on the first horizontal surface.

2. The semiconductor apparatus of claim 1, wherein the current flow associated with the resistive path is arranged to flow within the at least one elongated 3-dimensional structure.

3. The semiconductor apparatus of claim 1, wherein the current flow associated with the resistive path is arranged to flow in an interface between the at least one elongated 3-dimensional structure and the substrate.

4. The semiconductor apparatus of claim 1, wherein the first horizontal collection contact is connected to the at least one elongated 3-dimensional structure and the current flow associated with the resistive path is arranged to flow through the substrate at a distance from the at least one elongated 3-dimensional structure.

5. The semiconductor apparatus of claim 1, wherein the substrate is of semiconductor material of a first type and the at least one elongated 3-dimensional structure comprises a column of a second type semiconductor material.

6. The semiconductor apparatus of claim 1, wherein the at least one elongated 3-dimensional structure is formed of a plurality of sphere shaped objects consecutively arranged to the path subtending the first horizontal surface and the second horizontal surface.

7. The semiconductor apparatus of claim 1, wherein the substrate is of semiconductor material and the at least one elongated 3-dimensional structure comprises an isolator material column.

8. The semiconductor apparatus of claim 1, wherein the substrate is of semiconductor material and the at least one elongated 3-dimensional structure comprises a hole extending through the substrate.

9. The semiconductor apparatus of claim 1, wherein the substrate is of semiconductor material and the at least one elongated 3-dimensional structure comprises a metal composition column.

10. The semiconductor apparatus of claim 1, wherein the second bias is created by an avalanche break down mechanism at the junction of the third horizontal contact electrode and the at least one elongated 3-dimensional structure.

11. The semiconductor apparatus of claim 1, wherein the at least one elongated 3-dimensional structure comprises an outer layer of the semiconductor material of the second type.

12. The semiconductor apparatus of claim 11, wherein the amount of doping atoms in the outer layer is greater than the amount of doping atoms in the surrounding substrate.

13. The semiconductor apparatus of claim 1, wherein the substrate and the at least one elongated 3-dimensional structure are made of semiconductor materials of different doping, and the doping levels are adjusted so that during operation, the at least one elongated 3-dimensional structure will not deplete completely.

14. A The semiconductor apparatus of claim 1, wherein the first horizontal collection contact in the first horizontal surface is a collection contact for collecting the signal carrier charges and the apparatus further comprises a second horizontal collection contact in the second horizontal surface for collecting the secondary charges.

15. The semiconductor apparatus of claim 1, wherein it comprises a plurality of pixels, each pixel comprises at least one elongated 3-dimensional structure and at least one collection contact.

16. The semiconductor apparatus of claim 15, wherein the elongated structures of at least adjacent pixels are formed as an integrated body.

17. The semiconductor apparatus of claim 16, wherein the integrated body forms a net-like lattice extending to the substrate.

18. The semiconductor apparatus of claim 15, wherein at least one guard structure extends to substrate and surrounds the plurality of pixels.

19. The semiconductor apparatus of claim 18, wherein the at least one guard structure comprises at least one guard ring comprising elongated structures surrounding the plurality of pixels.

20. The semiconductor apparatus of claim 18, wherein the at least one guard structure comprises at least one continuous guard ring of integrated elongated structures surrounding the plurality of pixels.

21. The semiconductor apparatus of claim 1, wherein the apparatus is a power electronics device.

22. The semiconductor apparatus of claim 1, wherein the apparatus is a radiation detector.

* * * * *